(12) United States Patent
Shinoda et al.

(10) Patent No.: US 9,830,705 B2
(45) Date of Patent: Nov. 28, 2017

(54) IMAGE EVALUATION APPARATUS AND PATTERN SHAPE EVALUATION APPARATUS

(71) Applicant: HITACHI HIGH-TECHNOLOGIES CORPORATION, Tokyo (JP)

(72) Inventors: Shinichi Shinoda, Tokyo (JP); Yasutaka Toyoda, Tokyo (JP); Tsuyoshi Minakawa, Tokyo (JP); Ryoichi Matsuoka, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 309 days.

(21) Appl. No.: 14/377,728

(22) PCT Filed: Feb. 12, 2013

(86) PCT No.: PCT/JP2013/053175
§ 371 (c)(1),
(2) Date: Aug. 8, 2014

(87) PCT Pub. No.: WO2013/122022
PCT Pub. Date: Aug. 22, 2013

(65) Prior Publication Data
US 2015/0287201 A1    Oct. 8, 2015

(30) Foreign Application Priority Data

Feb. 14, 2012  (JP) ................................. 2012-029058
Dec. 17, 2012  (JP) ................................. 2012-274191

(51) Int. Cl.
*G06K 9/00*     (2006.01)
*G06T 7/00*     (2017.01)
(Continued)

(52) U.S. Cl.
CPC ............ *G06T 7/0044* (2013.01); *G06T 7/001* (2013.01); *H01J 37/222* (2013.01); *H01J 37/28* (2013.01);
(Continued)

(58) Field of Classification Search
None
See application file for complete search history.

(56) References Cited

U.S. PATENT DOCUMENTS 6,929,892 B2   8/2005   Shishido et al.
8,023,759 B2   9/2011   Tawarayama
(Continued)

FOREIGN PATENT DOCUMENTS

JP    2003-059813 A    2/2003
JP    2004-228394 A    8/2004
(Continued)

OTHER PUBLICATIONS

International Search Report issued in International Application No. PCT/JP2013/053175 dated May 7, 2013, with English translation.

*Primary Examiner* — Vikkram Bali
(74) *Attorney, Agent, or Firm* — McDermott Will & Emery LLP

(57) ABSTRACT

Provided are an image evaluation method and an image evaluation apparatus to evaluate a two-dimensional shape and a change in shape of a pattern side wall of a semiconductor pattern based on a SEM image, thus estimating an exposure condition. To this end, a method and a device include a storage unit that stores a model indicating a relationship between a feature amount that is obtained by creating a plurality of outlines from a SEM image and an exposure condition, and outline creation parameter information corresponding to the model; an outline creation unit that creates a plurality of outlines from a SEM image using the
(Continued)

outline creation parameter information; and an estimation unit that uses a feature amount that is found based on the plurality of outlines created by the outline creation unit and the model to find an exposure condition.

23 Claims, 25 Drawing Sheets

(51) Int. Cl.
    *H01L 21/66*     (2006.01)
    *H01J 37/28*     (2006.01)
    *H01J 37/22*     (2006.01)

(52) U.S. Cl.
    CPC .......... *H01L 22/12* (2013.01); *G01B 2210/56* (2013.01); *G06T 2207/10061* (2013.01); *G06T 2207/10144* (2013.01); *G06T 2207/30148* (2013.01); *H01J 2237/221* (2013.01); *H01J 2237/24578* (2013.01); *H01J 2237/24592* (2013.01); *H01J 2237/2801* (2013.01); *H01J 2237/2817* (2013.01); *H01L 2924/0002* (2013.01)

(56) References Cited

U.S. PATENT DOCUMENTS

| | | |
|---|---|---|
| 2003/0038250 A1 | 2/2003 | Komuro et al. |
| 2003/0106999 A1 | 6/2003 | Komuro et al. |
| 2005/0221207 A1 | 10/2005 | Nagatomo et al. |
| 2007/0105243 A1 | 5/2007 | Nagatomo et al. |
| 2008/0204405 A1 | 8/2008 | Koike et al. |

FOREIGN PATENT DOCUMENTS

| | | |
|---|---|---|
| JP | 2005-064023 A | 3/2005 |
| JP | 2005-123318 A | 5/2005 |
| JP | 2005-286095 A | 10/2005 |
| JP | 2007-129059 A | 5/2007 |
| JP | 2008-140911 A | 6/2008 |
| JP | 2008-205017 A | 9/2008 |

Fig. 12A

```
Parameter combination information

No1    Number of outlines  Three, Inside  th30, th50, th90
No2    Number of outlines  Four,  Inside  th30, th50, th70, th90
No3    Number of outlines  Four,  Outside th30, th90, Inside  th30, th70
No4    Number of outlines  Six,   Inside  th30, th50, th90, Outside th30, th50, th90
Nom    Number of outlines m*  Two, Inside  th1, ···thm, Outside th1, ···thm
Non    Number of outlines  n, Inside  th1, ···thn
```

Fig. 12B

```
Parameter combination information

No1    Inside  th30, th50, th90
No2    Inside  th30, th50, th70, th90
No3    Outside th30, th90, Inside  th30, th70
```

Fig. 13A

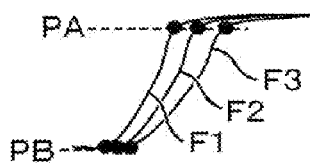

IMAGE EVALUATION APPARATUS AND PATTERN SHAPE EVALUATION APPARATUS

RELATED APPLICATIONS

This application is the U.S. National Phase under 35 U.S.C. §371 of International Application No. PCT/JP2013/053175, filed on Feb. 12, 2013, which in turn claims the benefit of Japanese Application No. 2012-029058, filed on Feb. 14, 2012 and Japanese Application No. 2012-274191, filed on Dec. 17, 2012, the disclosures of which are incorporated by reference herein.

TECHNICAL FIELD

The present invention relates to an apparatus or the like to evaluate a pattern shape of a semiconductor pattern. The present invention further relates to an apparatus or the like to evaluate a pattern shape of a semiconductor pattern, and particularly relates to a pattern shape evaluation apparatus that is suitable to find an appropriate manufacturing condition of semiconductor or to extract a parameter to find an appropriate manufacturing condition for semiconductor.

BACKGROUND ART

Conventionally a pattern shape of a semiconductor device is controlled in its manufacturing process using the dimensions such as a width of a line pattern or a diameter of a hole measured with a length-measuring SEM as means to evaluate a pattern formed as to whether it is formed as designed. Along with the miniaturization of semiconductor devices, it becomes common to form a pattern of the exposure wavelength or less, and to this end, ultra-high resolution techniques such as off-axis illumination and optical proximity correction are introduced. However, a change in pattern shape due to process fluctuations includes a tilt of a pattern side wall, rounding of a corner of a pattern or a constriction of a pattern, and deformation of a pattern due to a change in aberration of an exposure device, which are difficult to measure with the measurement of the pattern. Then, a technique to evaluate a tilt of a pattern side wall is known by creating outlines of an upper part and a lower part of a pattern side wall, and evaluating the tilt of the pattern side wall based on the two-dimensional shape of the pattern and the width of a white-band (see Patent Document 1).

This method enables the evaluation based on the two-dimensional shape of the pattern and the degree of tilt in the height direction of the pattern.

Projection exposure is a method to transfer a semiconductor pattern on a wafer, where light for exposure is applied to a photomask as a shielding member with a pattern to be printed drawn thereon, whereby an image of the photomask is projected on resist on the water through a lens system. During the exposure, the focus and the dose are determined as conditions of the exposure, and if the resist has unevenness at the surface due to nonuniformity of the resist application, the focus and the dose will be shifted, and so the dimensions and the shape of the pattern transferred may change, which is different from the normal pattern. The focus may be deviated due to other factors such as non-flatness resulting from a photomask and aberration of a lens.

Theses deviations in the focus and the dose resulting from the resist application, the photomask and the aberration of a lens have repeatability, and so a method of finding a correction value for the focusing and the dose with a semiconductor measurement device and feed-backing the correction value to an exposure device (see Patent Document 2) is known. This method can correct the deviation of focus and dose resulting from the resist application, the photomask and the aberration of a lens, whereby variations in dimensions of a pattern can be suppressed.

Aberrations of a lens include coma and astigmatism. Astigmatism causes a phenomenon where light is collected at different positions between in the horizontal direction and in the vertical direction. For instance, when a hole pattern is created by transferring a circle pattern having the same dimension for the horizontal and the vertical directions, astigmatism, if any, will cause an oval pattern having different dimensions between the horizontal and the vertical directions. To correct this, a method of finding a focus value using a line pattern (see Patent Document 2) is used, in which a focus value in the horizontal direction is found using a vertical line pattern and a focus value in the vertical direction is found using a horizontal line pattern, and correction is performed based on these focus values, whereby the optimum exposure conditions for the horizontal direction and the vertical direction can be obtained.

A focus value varies with unevenness of a wafer, and so it is better to know focus values for the horizontal and the vertical directions at one position. To this end, a method of using a dedicated pattern such as a cross pattern or a wedge-shaped pattern to obtain a vertical line pattern and a horizontal line pattern at one time also is available (see Patent Document 3).

CITATION LIST

Patent Literatures

Patent Literature 1: JP 2004-228394 A
Patent Literature 2: JP 2005-64023 A (corresponding to U.S. Pat. No. 6,929,892)
Patent Literature 3: JP 2008-140911 A (corresponding to U.S. Pat. No. 8,023,759)

SUMMARY OF INVENTION

Technical Problem

It is impossible in some cases to judge whether the focus should be negative or positive from the white-band width. As patterns become finer, process fluctuations have to be managed so that a fluctuation in a few nanometers could be detected for focus, for example. To find such a minute process fluctuation, rounding at an upper part and a skirt shape at a lower part of a pattern side wall has to be detected precisely. A change in shape of such rounding at an upper part and skirt shape at a lower part, resulting from process fluctuations, depend on various factors such as the pattern shape, the space in the pattern, the material and the thickness of a photoreceptor, and so a local change of the shape cannot be found from the tilt of the side wall that is found from the white-band width.

The following proposes an image evaluation apparatus having a first object to find such a local change precisely.

When a dedicated pattern such as a horizontal or vertical line pattern, a cross pattern or a wedge-shaped pattern is fabricated in a wafer and an image of such a dedicated pattern is shot, preparation is required therefor and so it takes time to perform such a job. Further, when a pattern is evaluated at a specific part or in a specific direction using a CD-SEM or the like, if noise is present partially on a SEM image, for example, an erroneous evaluation result may be obtained. Further, the absolute amount of a signal to output a measurement value may not be enough for a certain size of the cross pattern or the like, this may cause the failure in exposure condition evaluation based on a sufficiently precise measurement.

The following proposes a pattern shape evaluation apparatus having a second object to evaluate the exposure condition in X direction and/or in Y direction based on a plurality of measurement results including measurement results in a plurality of directions other than X direction and Y direction, and to output a parameter enabling evaluation of the exposure condition, the exposure condition or an adjustment condition of the exposure condition.

Solution to Problem

The following proposes, as one embodiment to fulfill the first object, an image evaluation apparatus configured to find an exposure condition of a semiconductor pattern from an image shot with an electron beam, including: a storage unit that stores a model indicating a relationship between a feature amount that is obtained by creating a plurality of outlines from a SEM image and an exposure condition, and outline creation parameter information corresponding to the model; an outline creation unit that creates a plurality of outlines from a SEM image using the outline creation parameter information; and an estimation unit that uses a feature amount that is found from the plurality of outlines created by the outline creation unit and the model to find an exposure condition.

In the proposed image evaluation apparatus, the outline creation unit creates three or more outlines. In the proposed image evaluation apparatus, the outline creation parameter information is information to let the outline creation unit create an outline, and includes the number of outlines and information to create each of the outlines corresponding to the number.

The following proposes, as one embodiment to create a model indicating a relationship between a feature amount that is obtained by creating a plurality of outlines from the SEM image and an exposure condition, an image evaluation apparatus configured to create a model using an exposure condition of a plurality of semiconductor patterns and a plurality of SEM images corresponding thereto, including: an outline creation unit that creates a plurality of outlines from a SEM images using outline creation parameter information; a model creation unit that creates a model equation from a feature amount obtained from the plurality of outlines created by the outline creation unit and an exposure condition corresponding to a SEM image; and an evaluation unit that uses a plurality of pieces of the outline creation parameter information to find corresponding models via the outline creation unit and the model creation unit, and finds a model with good evaluation from the plurality of models found and outline creation parameter information corresponding to the model.

As one embodiment to fulfill the second object, proposed is a pattern shape evaluation apparatus including an image processing apparatus configured to evaluate a target pattern included in an image formed by an image acquisition apparatus, the image processing apparatus being configured to find feature amounts of the target pattern in a plurality of directions, apply weight assigned for the plurality of directions to the feature amounts in the plurality of directions, and find a parameter required to adjust an exposure condition in a specific direction based on the weight.

Advantageous Effects of Invention

The above configuration enables finding of a change in curved shape of a pattern side wall as in rounding at an upper part and a skirt part at a lower part of the side wall or of a local change in shape at the side wall, and so enables detection of minute process fluctuations.

The above configuration enables finding of a parameter required for an exposure condition in X direction and/or Y direction (specific directions) based on feature amounts in a plurality of directions other than X direction and Y direction. This enables correct adjustment of an exposure condition using an actual pattern that may have insufficient edge amount in X direction and Y direction as in a dedicated pattern. Since feature amounts in X direction and Y direction can be extracted using an edge in a direction other than X direction and Y direction, precise evaluation can be performed based on sufficient information amount.

BRIEF DESCRIPTION OF DRAWINGS

FIG. 12 shows one example of an outline creation parameter.

DESCRIPTION OF EMBODIMENTS

Figure 1A:
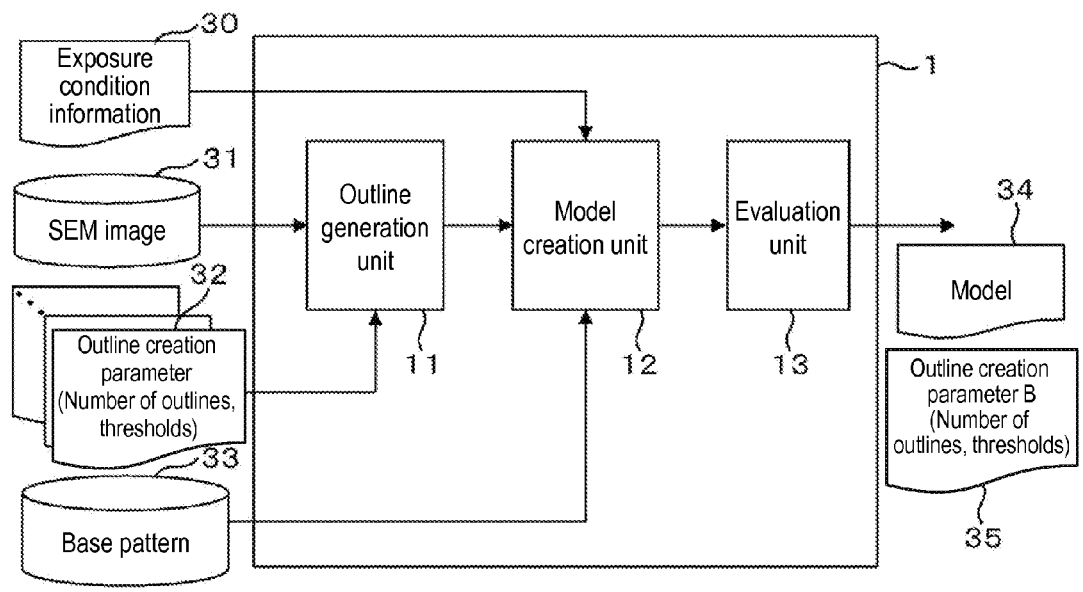
FIG. 1 shows an embodiment of an image evaluation apparatus.

The following describes an exemplary image evaluation apparatus as an embodiment, relating to a method for evaluating a pattern image to monitor process fluctuations using pattern image data shot by a SEM, and such an apparatus. The following describes a specific example thereof to detect process fluctuations using a two-dimensional shape of a plurality of outlines of the pattern based on image data.

The following describes an example to find a model to detect process fluctuations using a two-dimensional shape of a plurality of outlines of the pattern based on image data and creation parameters of the outlines as well.

Referring to the drawings, the following describes an apparatus equipped with the function to detect process fluctuations using a two-dimensional shape of outlines of the pattern based on image data and a measurement detection system. Specifically the following describes an apparatus including a Critical Dimension-Scanning Electron Microscope (CD-SEM) as one type of a measurement apparatus and such a system.

The following description exemplifies a charged particle radiation apparatus as an apparatus to form an image, and describes an example using a SEM as one embodiment. This is not a limiting example, and for instance, a focused ion beam (FIB) apparatus configured to form an image with an image beam scanned over a sample may be used as a charged particle radiation apparatus. Note that, however, since a very high magnification is required to measure a finer pattern precisely, a SEM is desirably used because a SEM is in general superior in the resolution to a FIB apparatus.

Figure 19:
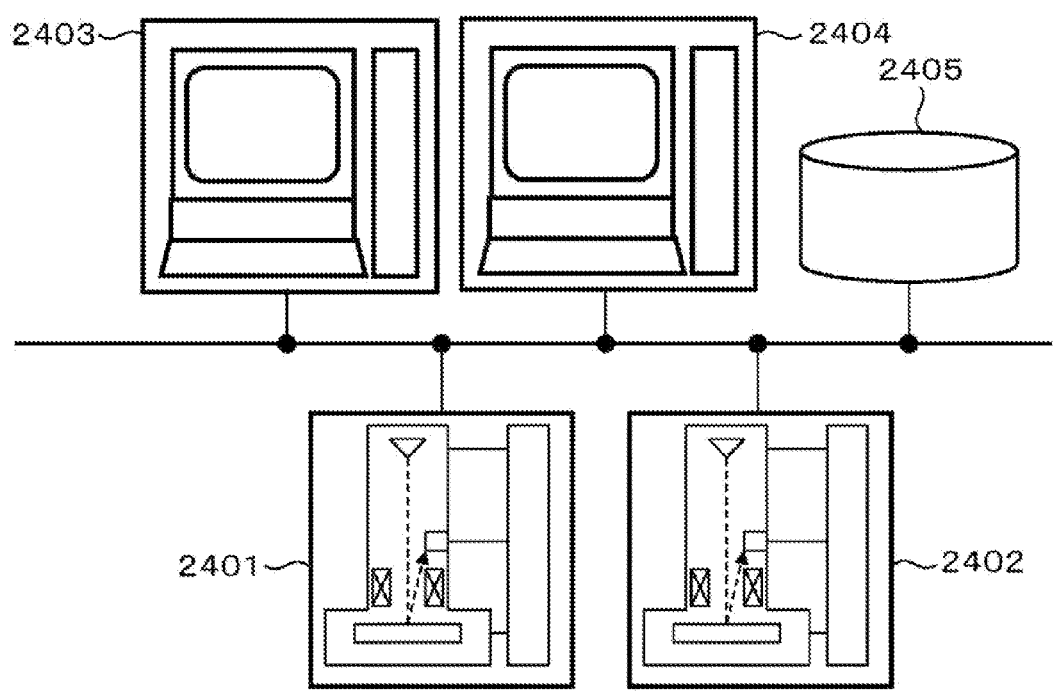
FIG. 19 describes one example of a semiconductor measurement system.

FIG. 19 schematically describes a measurement and examination system including a plurality of measurement or examination apparatuses connected to a network. This system includes a CD-SEM 2401 to measure dimensions of a pattern mainly on a semiconductor wafer, a photomask or the like, and a defect examination device 2402 configured to irradiate a sample with an electron beam, thus obtaining an image thereof and extracting a defect based on a comparison between the image and a reference image that is registered beforehand, which are connected to a network. To the network, a condition setting device 2403 to set a measurement position, a measurement condition and the like on design data of a semiconductor device, a simulator 2404 to simulate the appearance of a pattern based on the design data of the semiconductor device, manufacturing conditions of a semiconductor manufacturing apparatus and the like, and a storage medium 2405 to store design data of the semiconductor device in which layout data and manufacturing conditions of the semiconductor device are registered.

The design data is represented in the GDS format or the OASIS format, for example, which is stored in a predetermined form. The design data may be of any type as long as software to display the design data can display its format form, and can deal with it as graphic data. The storage medium 2405 may be built in a controller of the measurement device or the examination device, the condition setting device 2403 or the simulator 2404. The CD-SEM 2401 and the defect examination device 2402 each may have a controller, by which necessary control for the devices is performed, and these controllers may be equipped with the function of the simulator and the setting function of the measurement conditions and the like.

The SEM is configured to focus an electron beam emitted from an electron source with a plurality of stages of lenses and to let a scan deflector scan a sample with the focused electron beam one-dimensionally or two-dimensionally.

Secondary electrons (SE) or backscattered electrons (BSE) emitted from the sample during the scanning with an electron beam are detected by a detector, which are stored in a storage medium such as a frame memory while being in synchronization with the scanning by the scan deflector. Image signals stored in this frame memory are added up by an arithmetic device installed in the controller. Scanning by the scan deflector can be performed for any size, position and direction.

Such control, for example, is performed by the controller of each SEM, and images and signals that are obtained as a result of the scanning with an electron beam are sent to the condition setting device 2403 via a communication line network. The present example describes the controller to control each SEM and the condition setting device 2403 as separate members, which is not a limiting example, and the condition setting device 2403 may be configured to perform the control of the apparatus and the measurement processing collectively, or each controller may perform the control of each SEM and the measurement processing together.

The condition setting device 2403 or the controller stores a program to execute the measurement processing, and performs measurement or calculation in accordance with the program.

The condition setting device 2403 has a function to create a program (recipe) to control the operation of each SEM on the basis of the design data of semiconductor, and so functions as a recipe setting unit. Specifically, this device sets positions or the like to perform processing necessary to the SEM, such as a desired measurement point, automatic focusing, automatic astigmatism correction, addressing point and the like on the design data, the outline data of the pattern or the design data subjected to simulation, and creates a program to automatically control the sample stage, the deflector and the like of the SEM based on the setting. To create a template below described, the device further includes a processor to extract information on a region as the template from the design data and create the template based on the extracted information, or includes or stores a program therein to allow a general processor to create the template.

Figure 20:
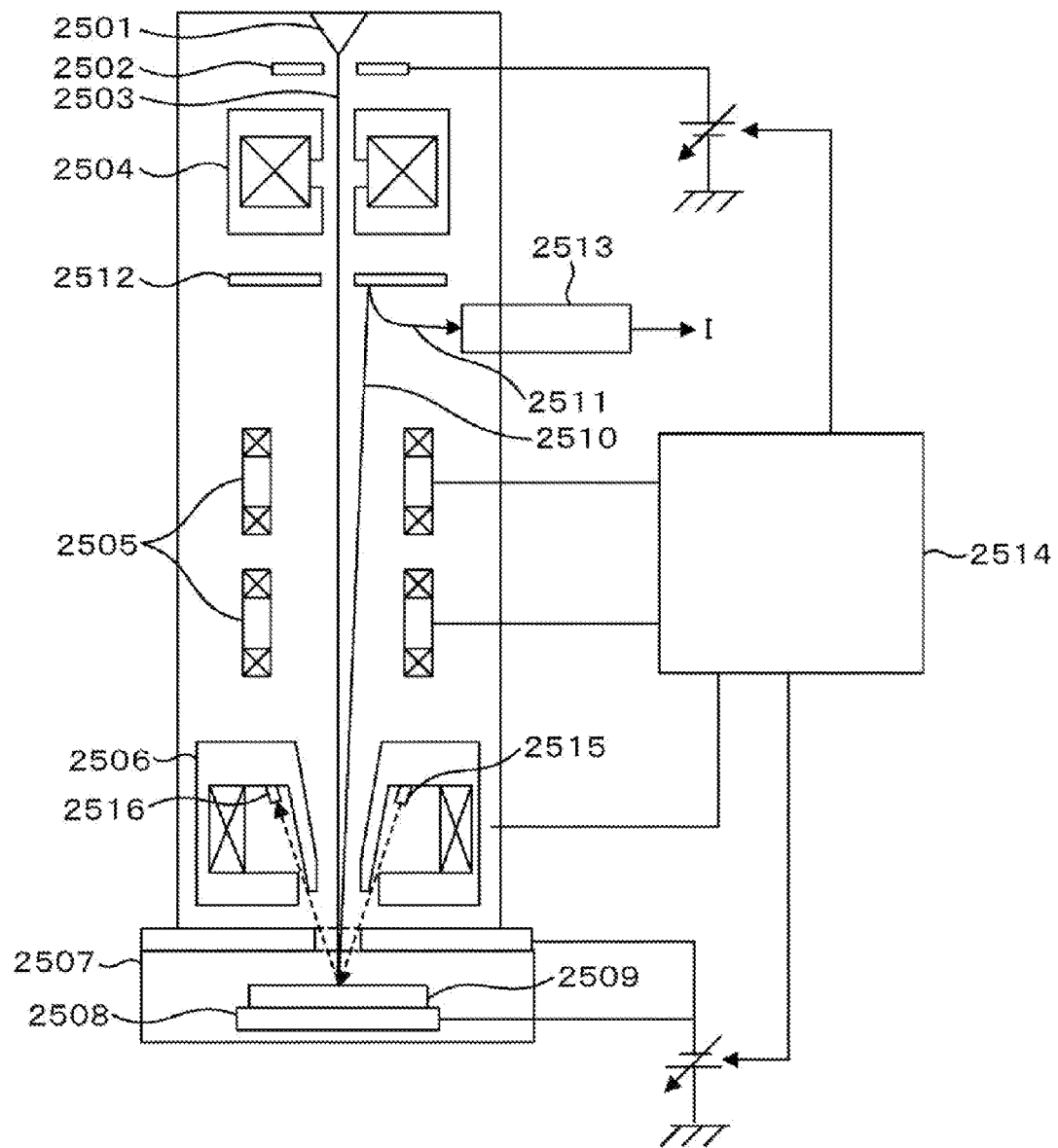
FIG. 20 schematically describes a scanning electron microscope.

FIG. 20 schematically describes the structure of the scanning electron microscope. An electron beam 2503 that is drawn from an electron source 2501 by an extracting electrode 2502 and is accelerated by a not illustrated accelerating electrode is narrowed by a condenser lens 2504 as one form of a focus lens, and then is scanned by a scan deflector 2505 over a sample 2509 one-dimensionally or two-dimensionally. The electron beam 2503 is decelerated by negative voltage applied to an electrode built in a sample mount 2508 while being focused by the action of an objective lens 2506 to be applied on the sample 2509.

When the electron beam 2503 is applied to the sample 2509, electrons 2510 such as secondary electrons and backscattered electrons are emitted from the irradiated position. The emitted electrons 2510 are accelerated toward the electron source by the action of acceleration due to the negative voltage applied to the sample, and collide with a conversion electrode 2512, thus generating secondary electrons 2511. The secondary electrons 2511 emitted from the conversion electrode 2512 are captured by a detector 2513, and the output I of the detector 2513 varies with the amount of captured secondary electrons. The brightness of a display not illustrated then varies with this output I. For instance, in order to form a two-dimensional image, a deflection signal to the scan deflector 2505 and the output I of the detector 2513 are synchronized, thus forming the image of the scanned region. The scanning electron microscope illustrated in FIG. 20 includes a deflector (not illustrated) that moves the scanned region with the electron beam.

The example of FIG. 20 describes the case of converting electrons emitted from the sample by the conversion electrode once for detection, which is of course not a limiting structure. For instance, it may be configured to dispose the detection face of an electron multiplier tube or the detector on the trajectory of accelerated electrons. A controller 2514 has a function to control various parts of the scanning electron microscope while having a function to form an image based on the detected electrons and a function to measure the width of a pattern formed on the sample based on the intensity distribution of the detected electrons called a line profile.

Next the following describes one embodiment of an image evaluation apparatus 1 for image recognition. The image evaluation apparatus 1 may be built in the controller 2514, image processing may be executed by an arithmetic device built therein, or image evaluation may be executed by an external arithmetic device (e.g., the condition setting device 2403) via a network.

Embodiment 1

FIG. 1A describes an exemplary model creation unit 1 of the image evaluation apparatus that creates a model to find the relationship between a SEM image and the exposure condition and outputs an outline creation parameter used therefor.

An image of a focus exposure matrix (FEM) wafer with a pattern printed thereon while changing the exposure conditions (focus, dose) for each shot (the unit of one exposure) is shot with a SEM beforehand. Since the position on the wafer indicates a correspondence with a shot under a certain exposure condition, such information is called exposure condition information 30. In FIG. 1A, such a plurality of different pieces of exposure condition (focus, dose) information 30 and SEM images 31 obtained by the shooting are used. A SEM image, if it has a deformed pattern and so is not suitable for model creation, has to be removed beforehand.

An outline creation unit 11 creates a plurality of outlines from the SEM image 31 on the basis of an outline creation parameter 32. The outline creation parameter 32 refers to information on the number of outlines to be created by the outline creation unit 11 and on a parameter to create each outline.

A model creation unit 12 uses the data on a plurality of outlines that is created by the outline creation unit 11 to find a feature amount, and associates is with information on the exposure condition (focus, dose), thus creating a model indicating the relationship between the feature amount and the exposure condition. An evaluation unit 13 uses the model created by the model creation unit 12 to evaluate the model.

For the creation of a model, it is important to find a parameter to create a plurality of outlines that is suitable to understand a change in the pattern side wall due to the exposure condition. This is because the shape of a pattern changes variously at rounding of an upper part and a skirt part of a lower part due to process fluctuations, depending on the pattern shape, the space of the pattern, the material and the thickness of a photoreceptor, and so the size of the change varies with the height of a viewing point of the side wall (height position). FIG. 13 illustrates an exemplary change of a pattern side wall with focus. In the example of FIG. 13A, when the focus changes as F1, F2 and F3, the point of the upper part PA shifts to right due to shrinkage of the photoreceptor at the upper part, whereas the point of the lower part PB of the photoreceptor does not change very much.

Figure 13B:
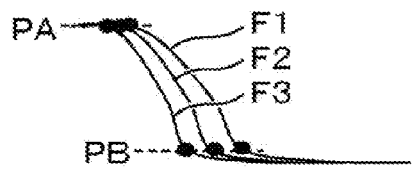
FIG. 13 shows a change of a pattern side wall with focusing.

In the example of FIG. 13B, when the focus changes as F1, F2 and F3, the point of the upper part PA changes less, whereas the point of the lower part PB of the photoreceptor shifts to left due to shrinkage of the photoreceptor at the lower part.

Figure 13C:
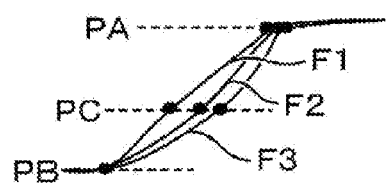
Figure 14:
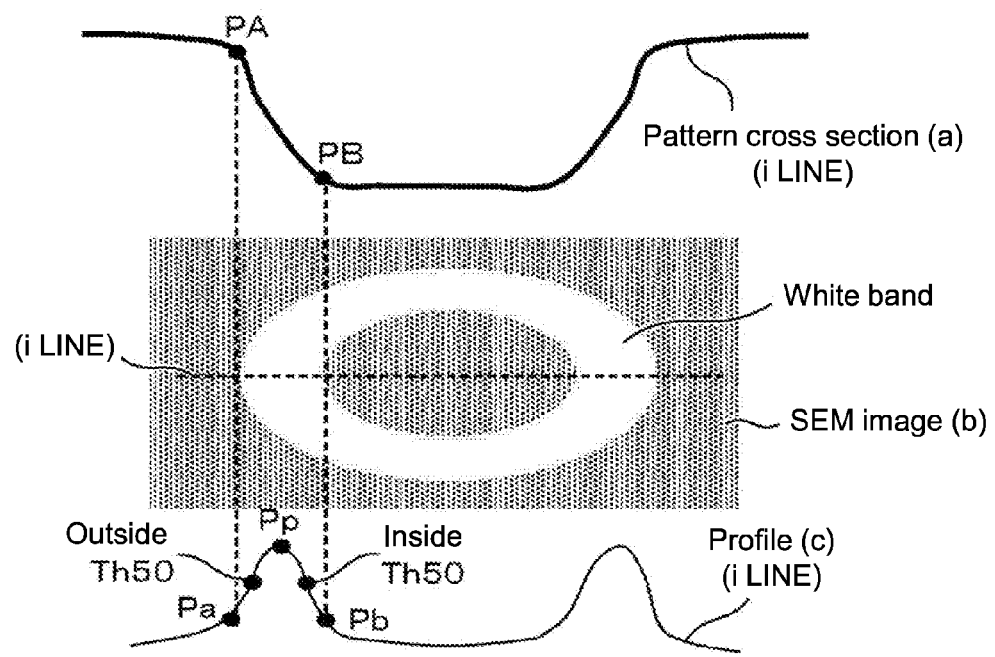
FIG. 14 shows the relationship between a threshold of an outline and a pattern side wall.

In the example of FIG. 13C, when the focus changes as F1, F2 and F3, the point of the upper part PA and the point of the lower part PB of the photoreceptor change less, whereas the point PC between the upper part PA and the lower part PB of the photoreceptor shifts to right due to shrinkage of the photoreceptor FIG. 14 illustrates the relationship between a threshold of an outline and a pattern side wall. This shows a hole pattern, where (a) is a cross-section of the pattern side wall part along i-line of the SEM image of (b). As shown in (b), the SEM image shows the shape of the pattern as a white band. A white band appears because, when a pattern is shot with a SEM, the amount of secondary electrons reflected against the pattern side wall increases and the brightness becomes high at that part, and so a part like a white band appears along the pattern shape. In this white band, a portion having the largest tilt of the cross section of the pattern side wall corresponds to the peak position Pp of the brightness of the white band in the profile (c). The upper part PA and the lower part PB of the pattern correspond to foot parts Pa and Pb, respectively, on both ends of the mountain of the profile indicating the brightness of the white band. Whether either one of the both sides of the white band corresponds to the upper part or the lower part of the pattern can be found using information on whether the inside or the outside of the pattern is a concave or a convex, for example.

Let that both sides of the white band are the inside and the outside, the circle on the inside of the white band corresponds to a concave and a lower part because it is a hole pattern. On the other hand, the circle on the outside of the white band corresponds to the upper part. In this way, the upper part and the lower part of the pattern or the position therebetween, for example, can be understood based on the profile of the brightness. When an outline is created from this profile, let that the peak of the white band is 100%, the position at 50% on the inside (right of the peak position) of the white band is set at a point of the outline to be created. Based on the profile of the brightness, similar positions at 50% on the inside (right of the peak side) of the white band at points along the pattern shape are connected to create a line, which is called an outline created on the inside at 50%. For instance, four points of 30%, 70% and 90% in addition to 50% may be used, and four outlines may be created similarly.

In that case, parameters to create the outlines may be "inside, th(threshold) 30, th(threshold)50, th(threshold)70 and th(threshold)90". Let that the peak is 100% and when an outline is similarly created at the position of 50% on the outside (left of the peak position) of the white band, a parameter may be set as "outside, threshold 50". A parameter of the outline creation parameter 32 to create each of the outlines corresponding to the number of outlines to be created is information on these thresholds.

In this way, an outline is created at any threshold corresponding to the height position of the pattern side wall using the profile of the white band including information on the height position of the pattern side wall.

When the pattern side wall hardly changes, process fluctuations cannot be detected. Conversely, when a height position changing greatly can be found, process fluctuations can be detected precisely. Further, when the height position found is only one, whether it may be at a position of the pattern side wall greatly changing or not, a change from the best position for the focus becomes uniform symmetrically, and so a determination as to whether the sign for focus estimation is to be positive or negative cannot be made. In the case of two height positions, a change in a rounded shape cannot be detected, and so a precise determination is difficult. Then, three or more height positions are considered, and their respective height positions are found so that a great change in a rounded shape can be detected. This enables the detection of a part where a rounded shape changes greatly at rounding of the upper part and a skirt part of the lower part, and so enables a precise determination of a sign for focus estimation and estimation of the exposure condition.

The following describes a difference between the case where a change is found using two points based on two outlines and the case where a change is found using three points based on three outlines.

For instance, let that two points based on two outlines are point A and point B, only one change between A and B can be detected based on the two points. On the other hand, when three points of A, B and C based on three outlines are used, three changes between A and B, B and C and A and C, i.e., a change at a plurality of parts can be detected. For information, in the case of four points of A, B, C and D based on four outlines, six changes between A and B, B and C, C and D, A and C, A and D, and B and D can be detected.

When the height position of the resist, which changes with focus, changes, it is difficult to find the value of focus precisely only from one variation that is obtained from two points based on two outlines.

When a local change occurs at two parts or a plurality of parts instead of at one part, since only one variation can be detected from two points, a change at one of the parts only has to be detected, or a plurality of changes has to be considered as one collectively for detection. For instance, let that a part close to point A changes on the positive side of the focus, and a part close to point B changes greatly on the negative side, only one of the part close to point A and the part close to part B has to be found, or a change including both of the part close to point A and the part close to point B has to be found when the change is found using two points based on two outlines. In the case of including both of the parts, it is not clear which one of the part close to point A and the part close to point B changes. The direction of the change may be reversed. On the other hand, three points based on three outlines enables detection as to which one of the part close to point A and the part close to point B changes, and estimation on the negative side can be performed using three variations, from which improved precision can be expected. Further, four points based on four outlines enables detection of six changes, and so a change at more height positions of the resist can be detected. Although, in the case of one variation, its absolute value only is used, three variations enable the usage of not only their absolute values but also variations of relative values and difference values.

In this way, three or more outlines used enables finding of variations at a plurality of resist height positions, thus improving the estimation precision of the focus value. Note here that too many outlines used means longer processing time, which is not practicable, and so ten or less outlines are sufficient. More outlines means that adjustment of a threshold is not required, and a fixed threshold can be used. When less outlines are used due to the restriction of processing time, it is effective that the resist height position that changes with focus is found. For instance, outlines are created with thresholds of a lot of different resist height positions, and such outlines are used to examine thresholds between points having large variations due to focus, and the actual evaluation can be performed using the outlines at selected thresholds.

When a pattern side wall is viewed at a plurality of height positions, it is difficult to determine what a height position is good for the detection of a large change in shape while associating it with how to take the feature amount and a model. Therefore, a model obtained as a result is evaluated by the evaluation unit 13 for determination. That is, the outline creation parameter 32 having good evaluation as the model can be a parameter to create an outline showing an effective feature for the model to find the exposure condition, and a parameter to create an outline that can represent a variation in shape of the pattern side wall well.

Then, a plurality of models are created by the above processing using a plurality of outline creation parameters 32, and the evaluation unit 13 evaluates the models about how to fit and outputs a model 34 having the highest evaluation value and such an outline creation parameter 35.

This allows the creation of an outline creation parameter and a model that can deal with various changes at the pattern side wall due to factors such as the pattern shape, the space in the pattern, the material and the thickness of a photoreceptor.

FIG. 12A shows one example of a plurality of outline creation parameters. As illustrated in FIG. 12A, the outline creation parameter 32 is information on the number of outlines and on height positions (thresholds) corresponding to the outlines in number, to which information whether it is an upper part or a lower part of the pattern side wall, such as information on the inside or the outside of the white band of the pattern or a concave or a convex of the pattern, may be added. One outline creation parameter may be indicated in each line and the list of a plurality of lines may be created, which is then processed one by one from the above. Alternatively, the number of outlines may not be indicated explicitly as in FIG. 12B, because the number of outlines can be determined based on the information on the number of height positions (thresholds), and this may be information of a plurality of height positions (thresholds) at which outlines are to be created.

Figure 2:
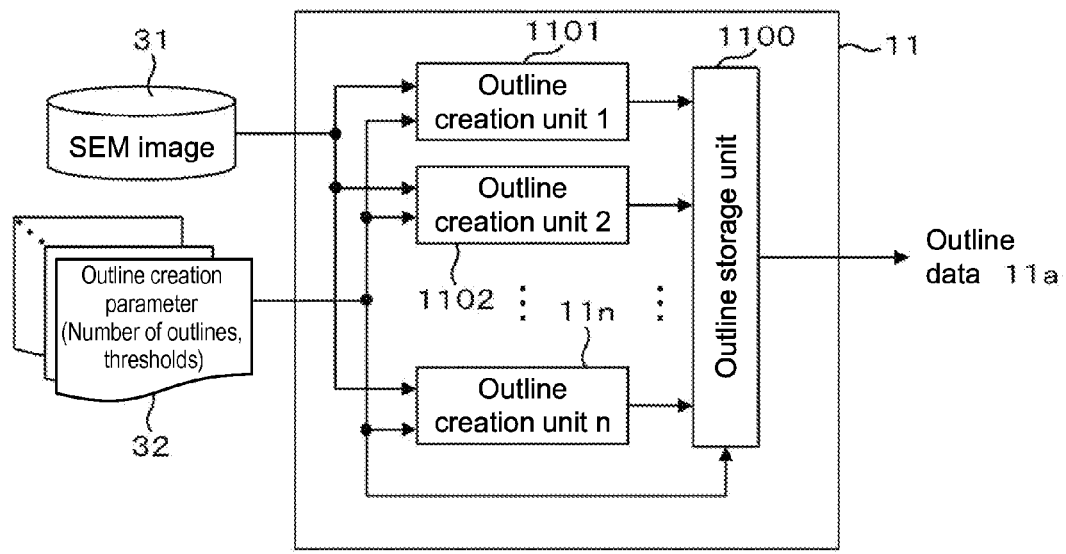
FIG. 2 shows an embodiment of an outline creation unit.

FIG. 2 illustrates an embodiment of the outline creation unit. The outline creation unit 11 creates a plurality of pieces of outline data 11a for a SEM image 31 based on the outline creation parameter 32.

When the number of outlines that the outline creation parameter 32 creates is n, for example, parameters to create these outlines are read in n pieces of outline creation units 1101 to 11n, respectively. Then, the outline creation units 1101 to 11n create the n pieces of outlines based on the SEM image. The created outline data may be stored in an outline storage unit 1100. Although n pieces of the outline creation units are used in this case, one outline creation unit may be used to create an outline n times.

Figure 3:
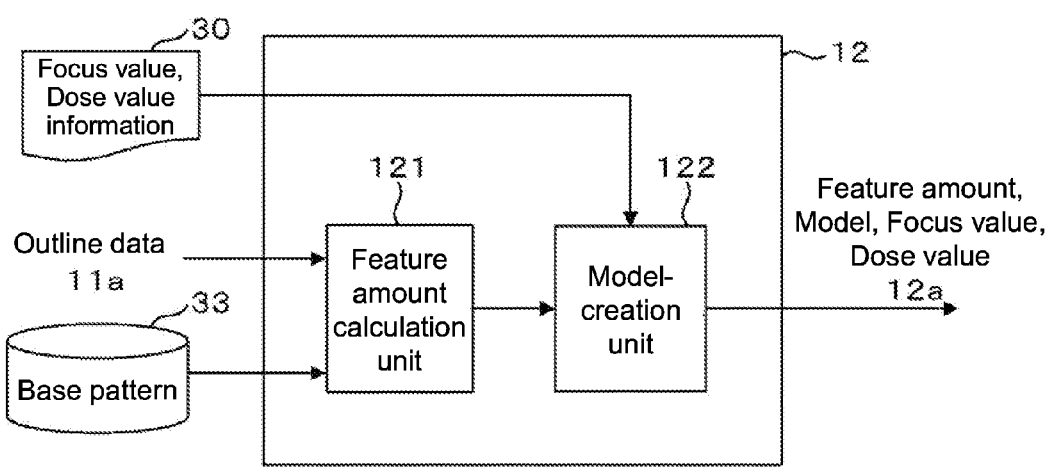
FIG. 3 shows an embodiment of a model creation unit.

FIG. 3 shows an embodiment of the model creation unit. The model creation unit finds a feature amount from the outline data created by the outline creation unit 11, and creates a model indicating the relationship between the Focus value, the Dose value information and the feature amount.

A feature amount calculation unit 121 aligns the outline data and a base pattern, and finds a distance between each pixel of the outline and a corresponding pixel position of the base pattern. Alignment of the outline data and the base pattern is performed by forming images of the outline data and the base pattern, both of which are expanded, and are matching-treated based on normalized correlation for alignment. Alternatively, images of them are formed, then their weighted centers are found, and alignment may be performed so that their weighted centers are overlapped. They are not limiting examples, and alignment of the outline data and the base pattern may be performed by known matching techniques. The base pattern may be design data, simulation data, or image data or outline data that is created from one or a plurality of SEM images. One of a plurality of pieces of outline data created by the outline creation unit 11 may be the base pattern. Following the alignment, pixels of the outline and the base pattern are associated while setting a pixel of the base pattern that is the closest to the pixel of the outline as a corresponding pixel of the base pattern, and finding the distance between these corresponding pixels. The distance for all pixels of the outline from their corresponding pixels of the base pattern is found, and the static amount of the distance found for all pixels, e.g., the average value or the dispersion value, is set as a feature amount. Instead of all pixels, it may be found from a plurality of pixels. The feature amount may include a plurality of types. This feature amount is found for each outline. The correspondence between the pixels is found with reference to pixels of the outline, which may be found with reference to pixels of the base pattern. It is known that line edge roughness changes with its exposure conditions, and line edge roughness has periodicity. Then, a spatial frequency such as by Fourier transform (FFT) may be found and a feature amount indicating the periodicity of the line edge roughness may be used, whereby a focus value may be found.

Based on the feature amount for each outline that is found by the feature amount calculation unit 121 and the exposure condition (focus value, dose value) information 30, a model-creation unit 122 creates a model. The model may be created by finding a regression equation or may be found by linear programming. For instance, the exposure condition Y may be represented in the regression equation by the linear sum of the feature amounts A1, A2 . . . An with their respective weight coefficients X1, X2, . . . Xn, $$Y = X1A1 + X2A2 + \ldots XnAn + b.$$

In this case, the model will be values of the weight coefficients X1, X2, . . . Xn of the feature amounts and b. Although not illustrated, the model-creation unit 122 may include a storage unit such as a memory to store information on the exposure condition and a feature amount obtained from outlines of a SEM image.

Figure 4:
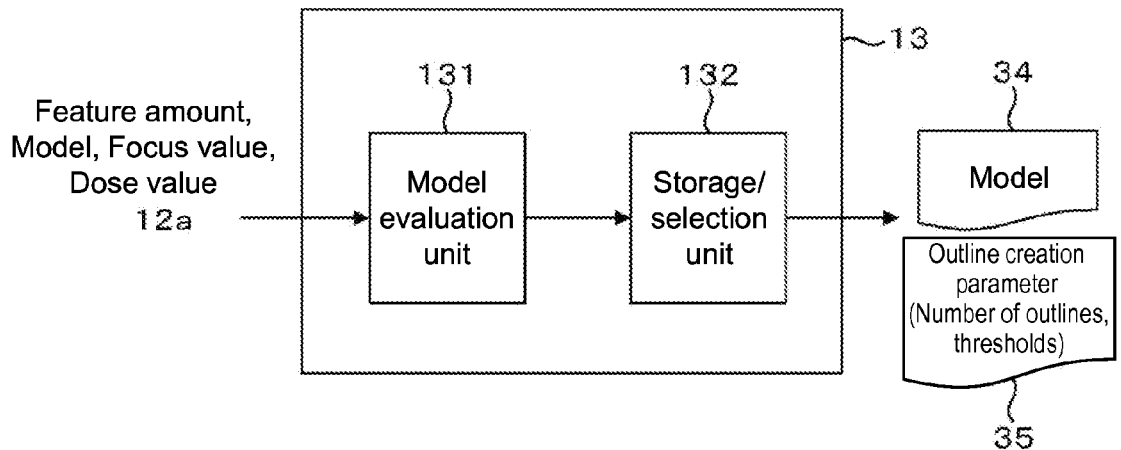
FIG. 4 shows an embodiment of an evaluation unit.

FIG. 4 shows an embodiment of the evaluation unit.

The evaluation unit 13 evaluates a plurality of models found by the model creation unit 1, and selects the best model and such an outline creation parameter among them based on their evaluation values.

A model evaluation unit 131 evaluates the fitting of a model. Fitting may be evaluated, for example, by finding adjusted R-square as an evaluation value for fitting. The evaluation value may be determined based on the criterion of Akaike's Information criterion (AIC), or another known technique may be used. The evaluation value, the model and the outline creation parameter found by the model evaluation unit 131 are stored at a storage/selection unit 132, and a model 34 and an outline creation parameter 35 having the best evaluation value among the stored plurality of model evaluation values are output. Since it takes time to create the number of outlines, the evaluation value may be decided based on not only the fitting of a model but also to be decreased with an increase in the number of outlines, and in the case of models having the same evaluation value but having different number of outlines, the model having a smaller number of outlines may have a better evaluation value.

Figure 1B:
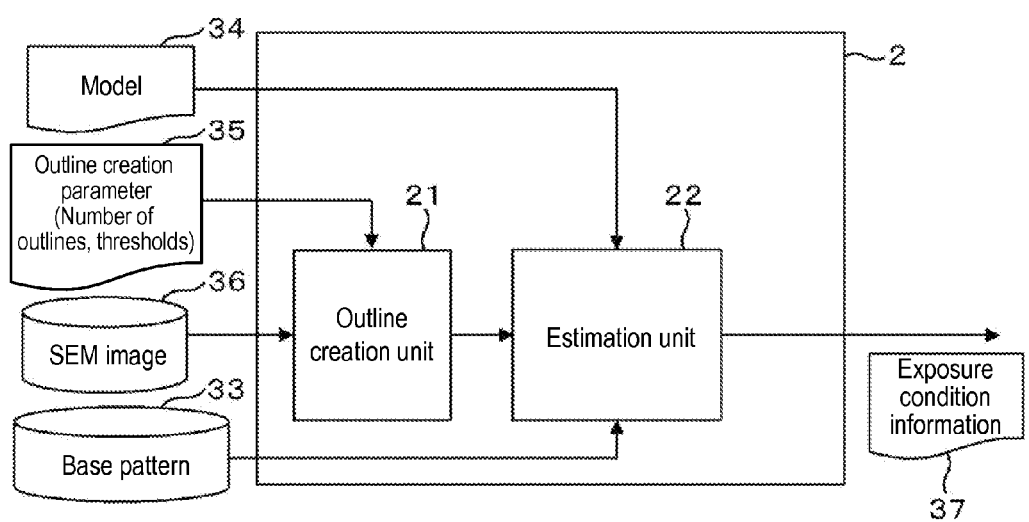

FIG. 1B describes an exemplary exposure condition estimation part 2 of the image evaluation apparatus that estimates an exposure condition from a SEM image using the model 34 and the outline creation parameter 35 found by the image evaluation apparatus 1.

Figure 5:
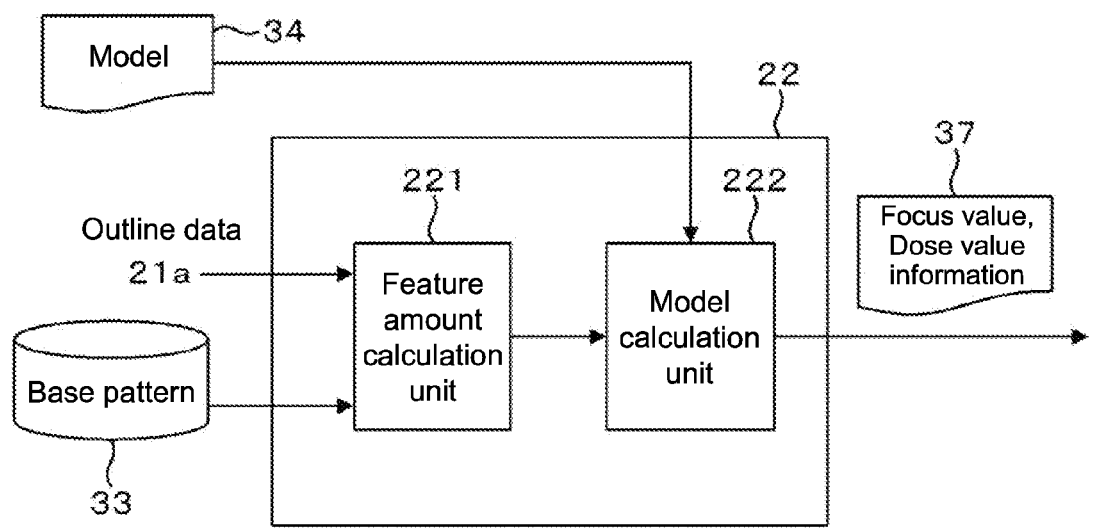
FIG. 5 shows an embodiment of an estimation unit.

An outline creation unit 21 creates a plurality of outlines from the SEM image based on the outline creation parameter 35 found by the model creation unit 1, and a feature amount is found from the created plurality of outlines, and then an estimation unit 22 estimates the exposure condition using the model found by the model creation unit 1. The outline creation unit 21 is the same as the outline creation unit 21 illustrated in FIG. 1A. FIG. 5 shows an embodiment of the estimation unit.

A feature amount calculation unit 221 calculates a feature amount from the plurality of outlines created by the outline creation unit 21. This feature amount calculation unit 221 is the same as the feature amount calculation unit 121 described referring to FIG. 3, and so the descriptions are omitted.

A model calculation unit 222 uses the model found by the model creation unit 1 to estimate the dose based on the feature amount obtained by the feature amount calculation unit 221.

When the model has the values of weight coefficients X1, X2, . . . Xn of the feature amounts and b and the feature amounts obtained by the feature amount calculation unit 221 are A1, A2 . . . An, then the dose can be estimated as follows:

$$Y=X1A1+X2A2+ \ldots XnAn+b.$$

Figure 15:
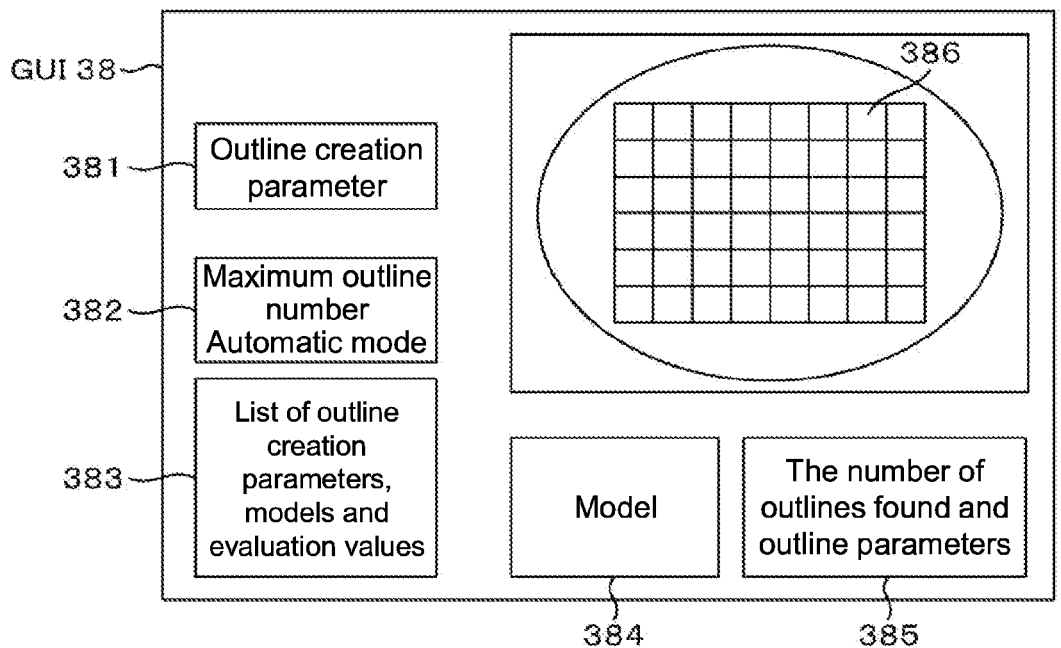
FIG. 15 shows an embodiment of a GUI of display means.

The estimated result may be displayed by display means on a GUI screen 38 as illustrated in FIG. 15, where the result of the exposure condition that is found by the estimation based on the corresponding SEM image is disposed for display at the position indicated in a wafer map 386, or a difference between the exposure condition of the pattern and the exposure condition estimated using the model may be shown. Different colors may be used depending on such a difference. A setting unit 381 may be provided, which creates three or more outlines to obtain a feature amount used at the estimation unit. This setting may be input manually by a user, or a file may be formed therefor during the model creation or beforehand, and such a file may be read.

The model 384 and the outline creation parameter 385 used may be displayed. When the model is a weight coefficient, the weight thereof is displayed. The outline creation parameter includes the number of outlines to be created and their thresholds.

When a model of exposure condition in FIG. 1A is created as well, an exposure condition from the SEM image and an exposure condition estimated based on the model may be disposed at a position indicated at a wafer map 386 as shown in FIG. 15. At this time, a window 383 may be provided to display models obtained using a plurality of outline creation parameters and their evaluation values. One model may be selected from the plurality of models, and the exposure condition and the exposure condition estimated based on the selected model may be displayed together at the position corresponding to the position on the wafer where the image is shot with the SEM when the model is used. As described above for the creation of the model of exposure condition in FIG. 1A, the exposure condition of FIG. 1B may be estimated similarly. Since it takes time to create outlines, a setting part 382 may be provided to set the maximum number of outlines depending on the allowable processing time, and so the outline creation part creates outlines in number less than the set maximum number of outlines, based on which a model having a good evaluation value and the outline creation parameter may be found. A plurality of outline creation parameters may be created automatically without setting the parameter externally, and then the model and the outline creation parameter may be found. In that case, the setting unit 382 may be configured to enable setting of an automatic mode. The increments of the height position (threshold) may be set at 10, and eleven parameters may be created automatically from 0 to the maximum value of 100 in increments of 10. Thresholds of a plurality of outlines including the inside and the outside of a pattern (upper part and lower part of the pattern side wall) may be changed with the increments, whereby a model having a good evaluation value and the outline creation parameter may be found.

Figure 6:
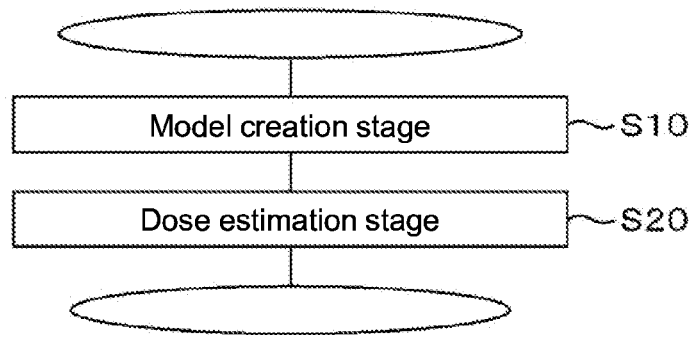
FIG. 6 shows the processing flow of an image evaluation method.

FIG. 6 shows the processing flow of an image evaluation method to find an exposure condition.

A model is created to estimate an exposure condition at the stage of model creation of S10, and an exposure condition is estimated from the SEM image using the model created at the stage of exposure condition estimation of S20.

Figure 7:
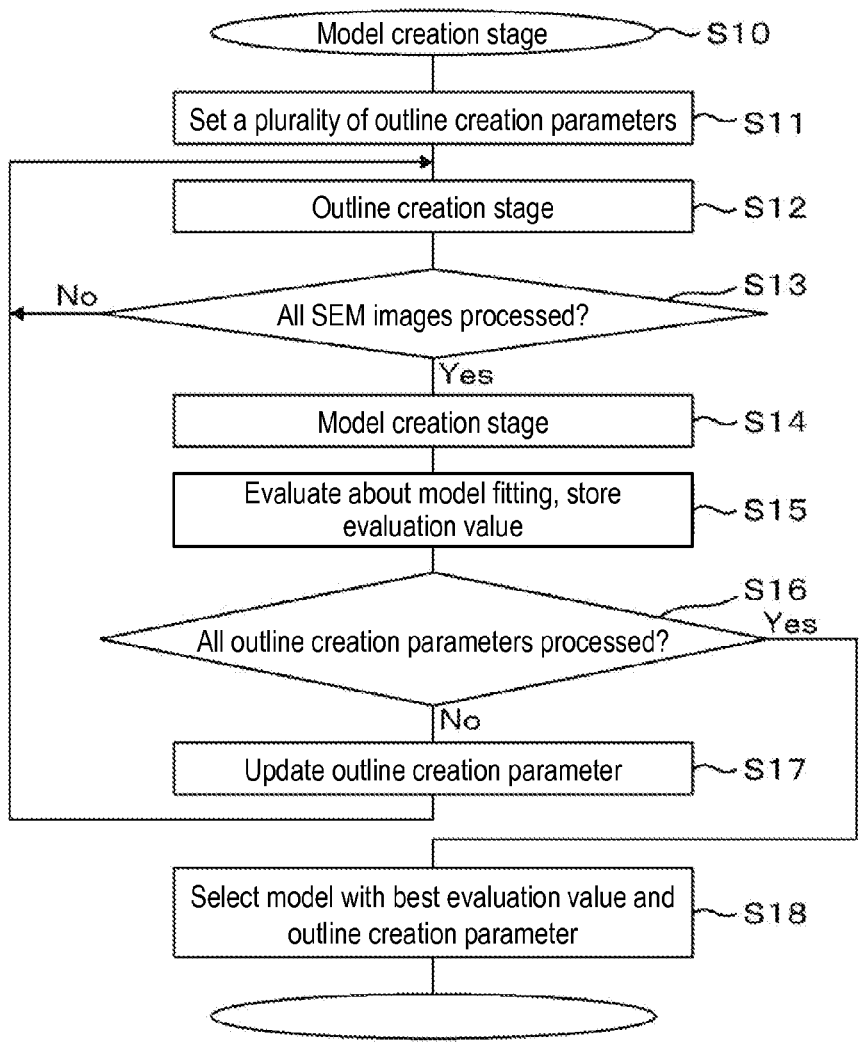
FIG. 7 shows the processing flow by a model creation unit.
Figure 8:
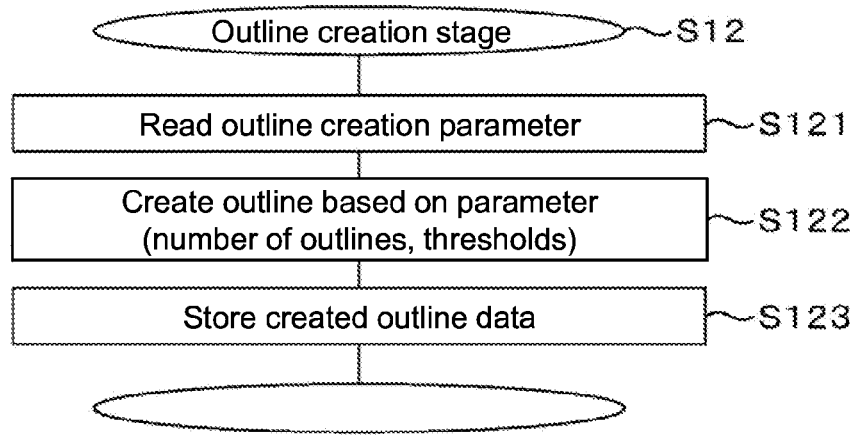
FIG. 8 shows the processing flow at the stage of outline creation.

FIG. 7 shows the processing flow by the model creation unit. The model creation unit sets a plurality of outline creation parameters at S11 to set outline creation parameters. At the stage of outline creation of S12, the model creation unit creates an outline based on one outline creation parameter of the set plurality of outline creation parameters. At S13, the model creation unit repeats the stage of outline creation until the outlines of all SEM images are created. When the outlines of all SEM images are created, the procedure shifts to the model creation stage at S14. At this model creation stage, the model creation unit finds a feature amount from a plurality of outlines created based on all SEM images, and creates a model indicating the relationship with the exposure condition. Then, at S15, the model creation unit evaluates the model created about fitting, and stores its evaluation result, the model and the outline creation parameter. At S16, the model creation unit checks whether the creation of a model for all of the outline creation parameters ends or not, and if it does not end, the model creation unit performs updating for the outline creation parameter without a model created therefor and reads it at S17, and repeats the above processing until models of all of the outline creation parameter are created. When models are created for all of the outline creation parameters, the model creation unit selects the model having the best evaluation rate and such an outline creation parameter among the created models at S18. FIG. 8 shows the processing flow of the outline creation stage. At the outline creation stage, an outline creation parameter is read at S121, and a plurality of outlines is created based on the number of outlines and their thresholds of such an outline creation parameter at S122. At S123, data on the created outlines is stored in storage means.

Figure 9:
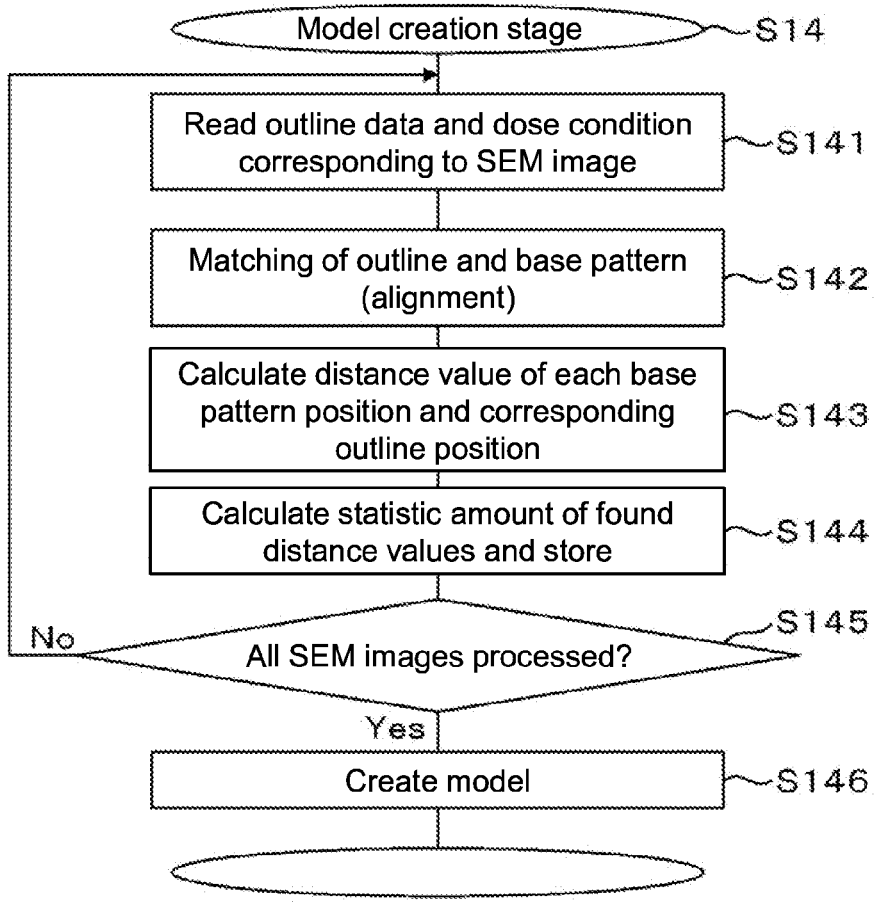
FIG. 9 shows the processing flow at the stage of model creation.

FIG. 9 shows the processing flow of the model creation stage. At S141, information on the outline data and the exposure condition (focus, dose) corresponding to the SEM image is read. At S142, alignment of each outline and the base pattern is performed. Then at S143, the distance from each pixel of each outline to the corresponding pixel of the base pattern is found, and at S144, the amount of statistics of the values of the distance found is calculated as a feature amount, and is stored in storage means. At S145, check is performed whether the feature amount is found for all of the SEM images used for the model creation, and if it is not found, the feature amount of the SEM images not found is found, and a model is created at S146 to create the model. A model is found based on the feature amount and its exposure condition by using a regression equation, linear programming or the like.

Figure 10:
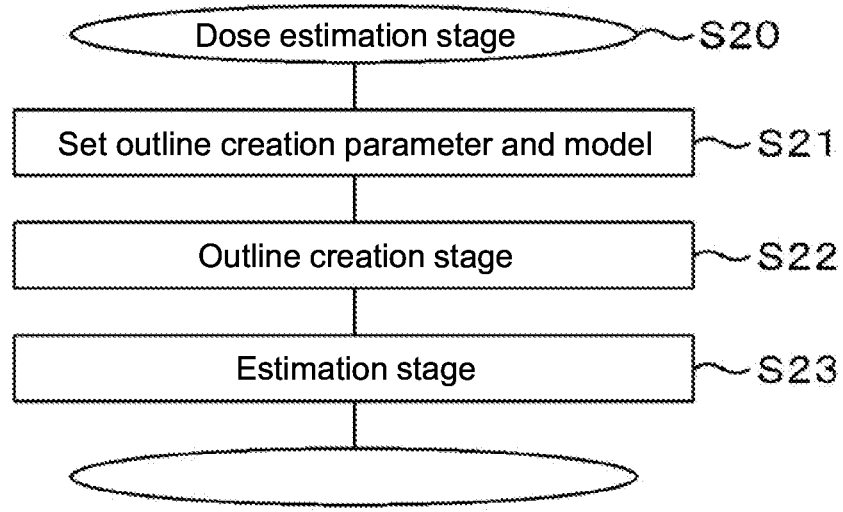
FIG. 10 shows the processing flow at the stage of dose estimation creation.

FIG. 10 shows the processing flow of the dose estimation stage.

At S21, the outline creation parameter and the model found at the model creation stage of S10 are set, at the stage of outline creation of S22, a plurality of outlines is created based on the number of outlines and their thresholds of the set outline creation parameter, and at the estimation stage of S23, a feature amount is found from the plurality of outlines, and an exposure condition is estimated using the model based on the feature amount. The outline creation stage of S22 is the same processing as that at the outline creation stage of S21.

Figure 11:
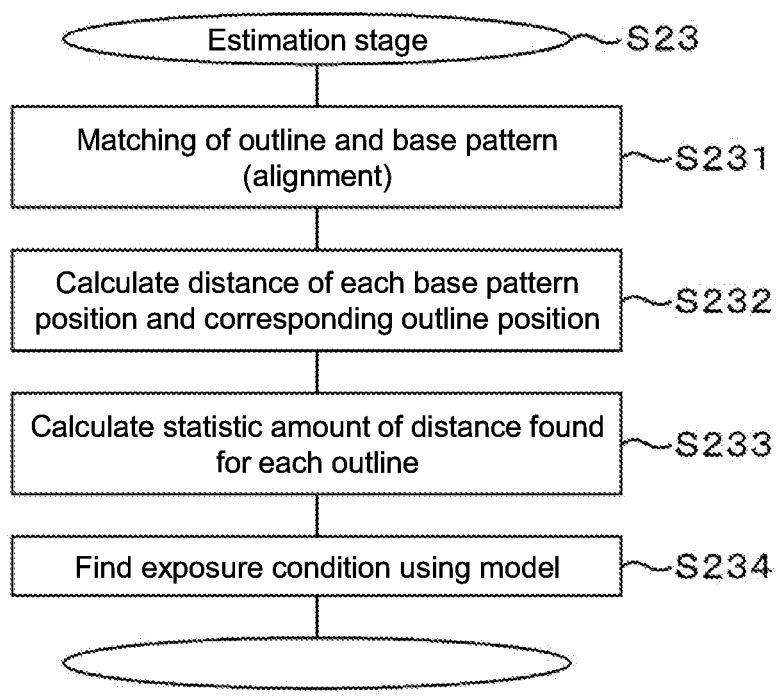
FIG. 11 shows the processing flow at the stage of estimation.

FIG. 11 shows the processing flow of the estimation stage. At S231, alignment of the outlines and the base pattern is performed, at S232, the distance from each pixel of each outline to the corresponding pixel of the base pattern is found, at S233, the amount of statistics (feature amount) of the values of the distance found is calculated, and at S234, a model is calculated based on the found feature amount, and the exposure condition is found.

Since the details of the alignment at S231 and the finding of distances at S232 are described above for the embodiment of the model creation unit of FIG. 3, their descriptions are omitted.

The above example creates a model using a regression equation or linear programming. Alternatively, a table for reference, from which an exposure condition is found while using the feature amount obtained from the plurality of outlines as an address, may be created, for example, and for the evaluation, an exposure condition may be found by referring to the created table based on the feature amount obtained from the plurality of outlines and using the address of the table having the closet value of the feature amount.

Figure 16:
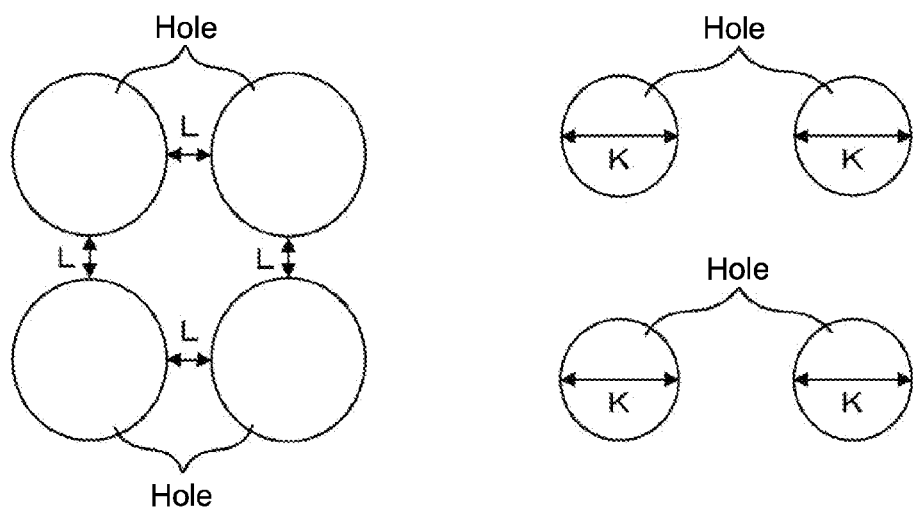
FIG. 16 shows a space in a pattern and the size of a hole diameter.

Next, the following considers a change of a pattern side wall due to an interval of a hole pattern and the size of the diameter of a hole as in FIG. 16. When a pattern is exposed, the pattern having a narrow interval L will shrink more at the upper part than the pattern having a wide interval, meaning changing more. In this way, when a pattern has an interval in the pattern smaller than a certain value, for example, a plurality of thresholds of outlines may be set at the upper part of the pattern only, when setting the outline creation parameter. When the hole pattern has a small diameter K, the pattern may change greatly at the lower part compared with the case of a large diameter.

Then, when the hole pattern has a diameter K that is smaller than a certain threshold, a plurality of thresholds of outlines may be set at the lower part of the pattern only, when setting the outline creation parameter.

Figure 17:
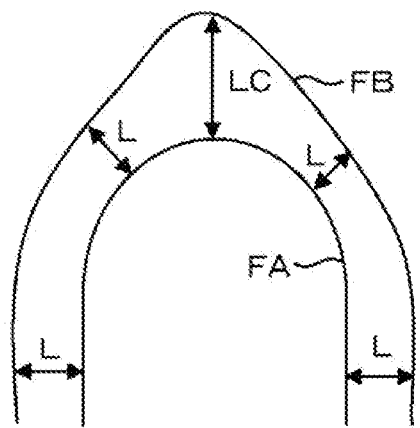
FIG. 17 shows a change of a pattern side wall at the end point part.
Figure 18:
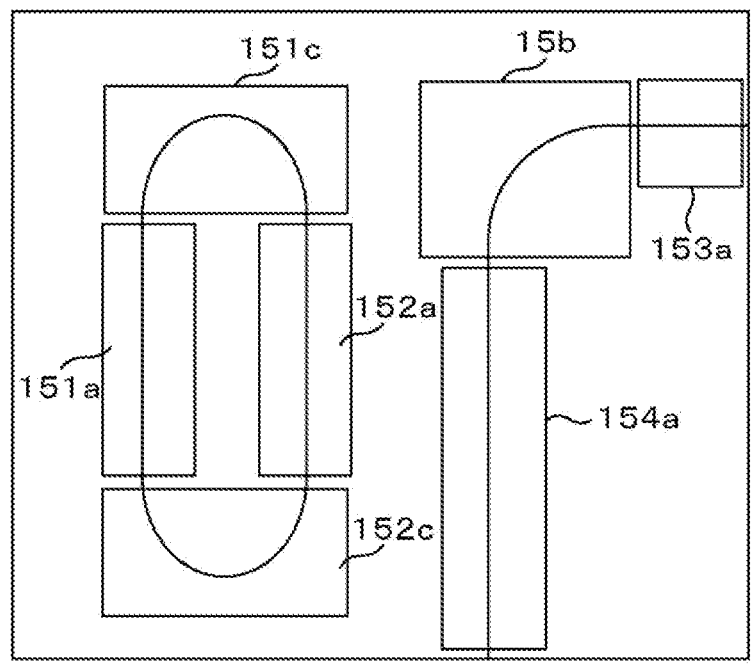
FIG. 18 describes an example to make a division into parts.

FIG. 17 shows a change due to focus at the line end (end point) part of a pattern. This is a view from the above, where the shape of focus FA and the shape of focus FB change differently in size between their central parts LC and end parts L of the end point. This is because light intensity changes from one part to another of the pattern due to diffraction of exposure light, and so the pattern side wall also changes differently among various parts such as the corner part, the linear part and the line end (end point) part. This means that, when the exposure condition may be found based on various patterns, a plurality of outlines may be created for each part of a SEM image, and a feature amount may be found to create a model for each part. In that case, an outline creation parameter is to be found for each part. For instance, when the pattern shown in FIG. 18 is used, the pattern may be divided into regions 151c, 152c as line end parts, regions 151a, 152a, 154a and 153a as linear parts, and a region 15b as a corner part, for each of which a model is created, and the evaluation of the model also may be performed for each part, and the model and the outline creation parameter for each part may be found.

Herein, evaluation is performed using outlines, and a plurality of points similarly found may be used instead of continuous points as the outline.

Embodiment 2

The following describes an embodiment that is a pattern shape evaluation apparatus configured to find an exposure condition of a semiconductor pattern based on an image shot with an electron beam that is one embodiment of charged particle radiation, including a feature amount extraction unit that finds a feature amount from a pattern image including a closed curve, and an estimation unit that uses the feature amount found by the feature amount extraction unit to estimate exposure conditions in at least two directions of vertical and horizontal directions.

Further proposed is an image evaluation apparatus that is a pattern shape evaluation apparatus configured to find an exposure condition including a focus value to form a semiconductor pattern based on an image shot with an electron beam, the pattern shape evaluation apparatus including a feature amount extraction unit that finds a feature amount for each direction from a pattern image including a closed curve, and an estimation unit that uses the feature amount found by the feature amount extraction unit to estimate exposure conditions in at least two directions of vertical and horizontal directions.

In the proposed pattern shape evaluation apparatus, the feature amount extraction unit finds feature amounts in at least two directions of vertical and horizontal directions based on directional information that is obtained by a direction detection unit that finds the directional information of a white band, a pattern edge or an outline.

In the proposed pattern shape evaluation apparatus, the feature amount extraction unit includes a feature amount extraction unit that finds a feature amount for each region that a user designates for each direction of two directions or more.

In the proposed pattern shape evaluation apparatus, estimation is performed by the estimation unit using a model or a table indicating a relationship between a feature amount for each direction found by the feature amount extraction unit and an exposure condition.

The proposed pattern shape evaluation apparatus includes a direction-specific feature calculation unit that calculates a ratio for a division into at least two directions of vertical and horizontal directions based on the directional information obtained by the direction detection unit.

As one embodiment to create a model indicating a relationship between a feature amount and an exposure condition for each direction of horizontal and vertical directions from the SEM images, the following proposes a pattern shape evaluation apparatus configured to find an exposure condition of a semiconductor pattern based on an image shot with an electron beam, the pattern shape evaluation apparatus including a feature amount extraction unit that finds a feature amount in at least two directions of vertical and horizontal directions from a pattern image including a closed curve, and a model creation unit that creates a model using the feature amount for each direction found by the feature amount extraction and an exposure condition corresponding to the SEM image.

In the proposed pattern shape evaluation apparatus, the model creation unit creates a model indicating a relationship between a feature amount and a dose for each direction of at least two directions including vertical and horizontal directions.

As one embodiment of a user interface of the above image evaluation apparatus, the following proposes a pattern shape evaluation apparatus including a display unit capable of displaying an exposure condition for each direction while switching on a wafer map.

The proposed pattern shape evaluation apparatus includes an instruction unit, allowing a user to designate a region where a feature amount for each direction is to be found.

As another embodiment, proposed is a pattern shape evaluation apparatus configured to find an exposure condition of a semiconductor pattern based on an image shot with an electron beam, including a direction detection unit that finds directional information of a white band, a pattern edge or an outline from a pattern image including a closed curve, a feature amount extraction unit that finds a feature amount in at least two directions of vertical and horizontal directions based on the directional information from the direction detection unit, and an estimation unit that estimates focus values in at least two directions of vertical and horizontal directions based on a model or a table indicating a relationship between a feature amount for each direction and a focus value.

Proposed is another pattern shape evaluation apparatus configured to find an exposure condition of a semiconductor pattern based on an image shot with an electron beam, including a feature amount extraction unit that finds a feature amount based on a pattern image including a closer curve, a contributing ratio calculation unit that calculates a contributing ratio to divide the feature amount based on a direction of an edge of the image into at least two directions of vertical and horizontal directions, and an estimation unit that estimates focus values in at least two directions of vertical and horizontal directions based on the feature amount, the contribution ratio, a model or a table indicating a relationship between a feature amount for each direction and a focus value.

As one embodiment to create a model indicating a relationship between a feature amount that is obtained by creating a plurality of outlines from the SEM image and an exposure condition, the following proposes a pattern shape evaluation apparatus configured to find an exposure condition of a semiconductor pattern based on an image shot with an electron beam, the pattern shape evaluation apparatus including a feature amount extraction unit that finds a feature amount in at least two directions of vertical and horizontal directions from a pattern image including a closed curve, and a model creation unit that creates a model indicating a relationship between a feature amount for each direction and a focus value using the feature amount for each direction found by the feature amount extraction and an exposure condition corresponding to the SEM image.

Such a configuration allows a feature amount for each direction to be detected from an image of a curved pattern such as a whole, irrespective of a pattern that is a vertical line or a horizontal line, and allows a focus value in each direction to be obtained.

A pattern shape evaluation apparatus illustrated in the following embodiment relates to a method and an apparatus to evaluate a pattern image to monitor an exposure condition including focus in the horizontal direction and the vertical direction from image data of a curved pattern shot by a SEM. The following describes, as a specific example thereof, the detection of an exposure condition including focus in the horizontal direction and the vertical direction using a two-dimensional shape of outlines of image data of the curved pattern.

The following further describes an example to find a model to detect the exposure condition including focus in the horizontal direction and the vertical direction and a creation parameter of an outline using a two-dimensional shape of outlines of image data of the curved pattern.

The following describes an apparatus equipped with a function to detect an exposure condition including focus in the horizontal direction and the vertical direction using a two-dimensional shape of outlines of a curved pattern, and a measurement test system, with reference to the drawings. Specifically the following describes an apparatus and a system including a CD-SEM that is one type of the measurement device.

Figure 21A:
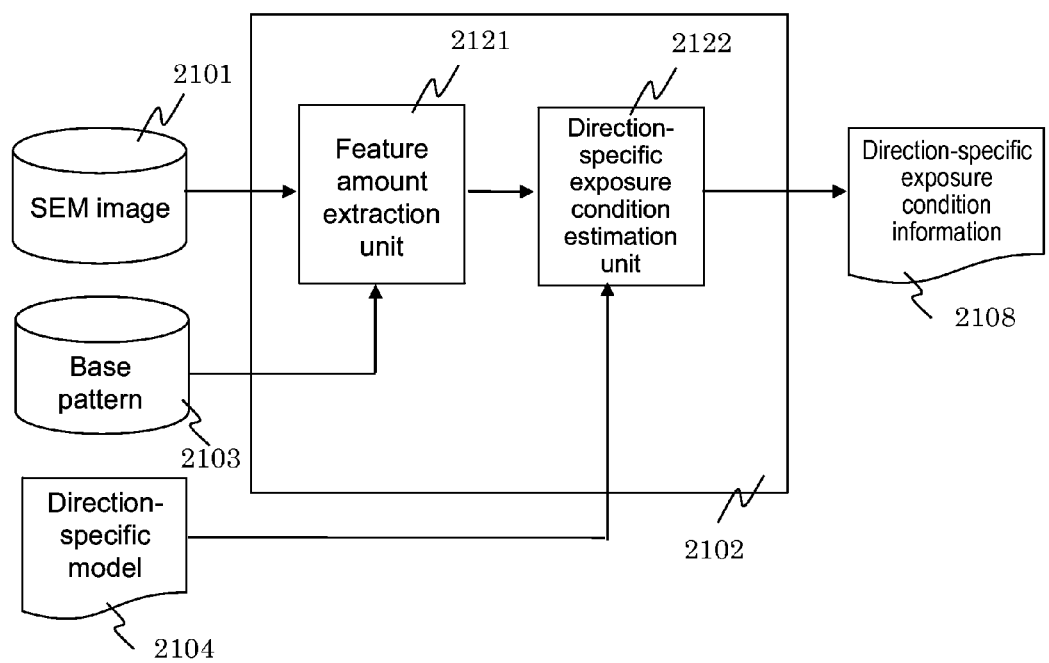
FIG. 21 shows an embodiment of an image evaluation apparatus.

FIG. 21A, B describes one example of an image processing apparatus 2102 to detect an exposure condition including focus in the horizontal direction and the vertical direction using a two-dimensional shape of outlines of image data of a pattern including a closed curve. An image of a focus exposure matric (FEM) wafer with a pattern printed thereon while changing the exposure conditions (focus, dose) for each shot (the unit of one exposure) is shot with a SEM beforehand. Since the position on the wafer shot indicates a correspondence between an image shot and its exposure condition, such information is called exposure condition information 7.

Figure 21B:
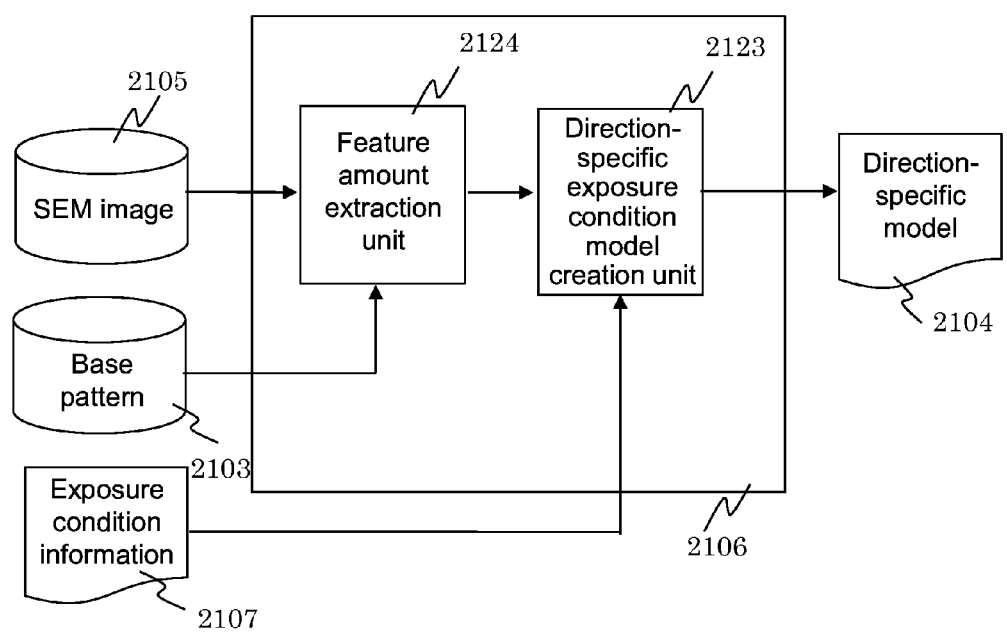

In FIG. 21B, such a plurality of different pieces of exposure condition (focus, dose) information 7 and a SEM image 2105 including a target pattern are used. A SEM image, if it has a deformed pattern and so is not suitable for model creation, may be removed beforehand.

A feature amount extraction unit 2124 uses the SEM image 2105 and a base pattern 2103 to extract a feature amount that changes with the exposure condition. Then, a direction-specific exposure condition model creation unit 2123 uses the feature amount found by the feature amount extraction unit 2124 and the exposure condition information 2107 to create a direction-specific model 2104 indicating a relationship between the feature amount and an exposure condition for each direction such as the horizontal direction or the vertical direction.

The exposure condition information 2107 may give, as information, an exposure condition including a focus value for each direction such as the horizontal direction or the vertical direction. The dimension value when the focus value is the best may be given. With reference to a focus value in one direction, a focus value in another direction may be given as a value indicating a ratio or a difference therefrom.

In FIG. 21A, a feature amount extraction unit 2121 extracts a feature amount using a SEM image 2101 to evaluate the exposure condition and a base pattern (reference pattern), and a direction-specific exposure condition estimation unit 2122 estimates a direction-specific exposure condition using the direction-specific model obtained in (b) and the feature amount obtained at the feature amount extraction unit 2121. The estimated direction-specific exposure condition information is fed-back to the exposure device, whereby the exposure condition can be corrected for each specific direction.

Herein, the base pattern may be image data obtained by drawing design data, image data obtained from a shot pattern image with good appearance, or image data obtained from a plurality of shot pattern images. This may be image data obtained from a simulation image.

Figure 22:
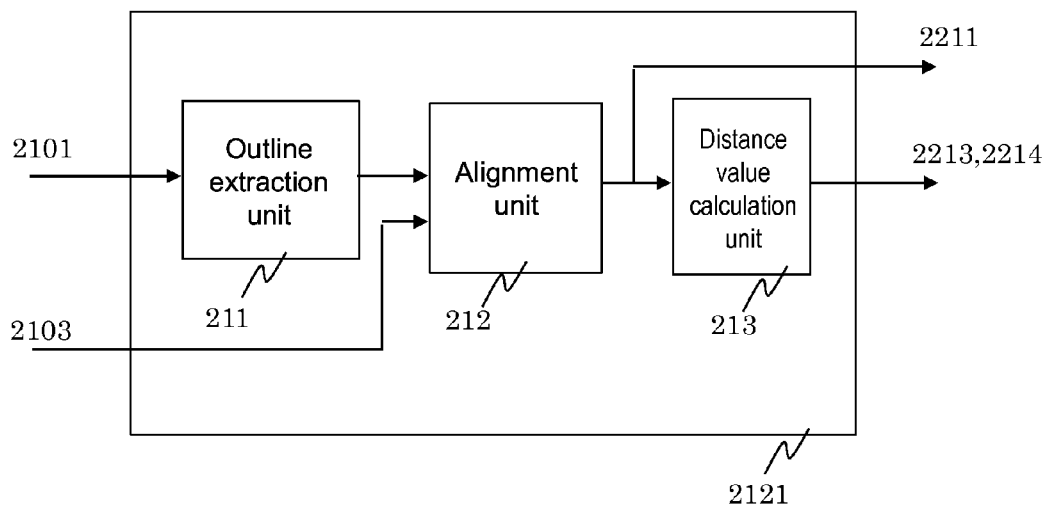
FIG. 22 shows an embodiment of a feature amount extraction unit.

FIG. 22 shows an exemplary feature amount extraction unit. The feature amount extraction unit 2121 extracts a feature amount that changes with outlines of the SEM image 2101 and the exposure condition from the SEM image 2101 and the base pattern 2103. The feature amount extraction units 2121 and 2124 of FIGS. 21A and B may have the same configuration. An outline extraction unit 211 extracts outlines of the SEM image 2101, and an alignment unit 212 performs alignment of image data of the base pattern 2103 and the outline data obtained at the outline extraction unit 211. Then a distance value calculation unit 213 finds a distance value of each pixel of the outline of the SEM image 2101 subjected to the alignment from the corresponding pixel position of the base pattern. The distance value found at the distance value calculation unit 213 is set as a feature amount. Correspondence between the pixel of the outline and the pixel of the base pattern may be found by searching for a pixel located on the line orthogonal to the direction of the pixel of the outline, or may be found by finding the closest pixels.

Figure 23:
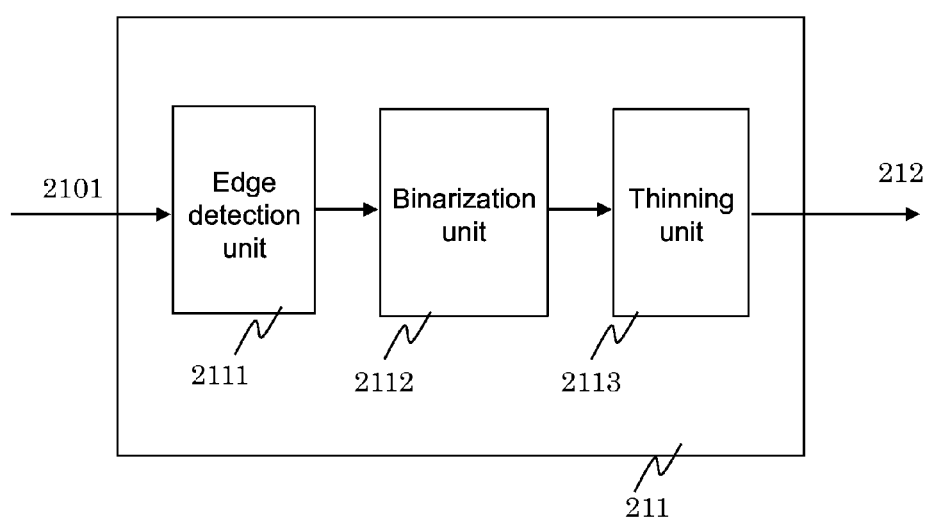
FIG. 23 shows an embodiment of an outline extraction unit.

FIG. 23 shows an exemplary outline extraction unit. An edge detection unit 2111 finds an edge image by filter processing to extract an edge from a SEM image 1 using a Laplacian filter or the like, a binarization unit 2112 binarizes with any threshold, and a thinning unit 2113 performs thinning, thus obtaining an outline. Alternatively, smoothing of white band may be performed for binarization, to which thinning is performed, thus obtaining an outline. Any other method may be used, as long as an outline to make the pattern shape visible can be found. The alignment unit 212 may perform a general method for alignment, such as a method to expand outline pixels and overlap the images while shifting the position, thus finding the position having the highest correlation value of normalized correlation, or a method to find the positions of weighted centers of the images and overlap their weighted center positions, thus aligning the two images, and their descriptions are omitted.

Figure 27:
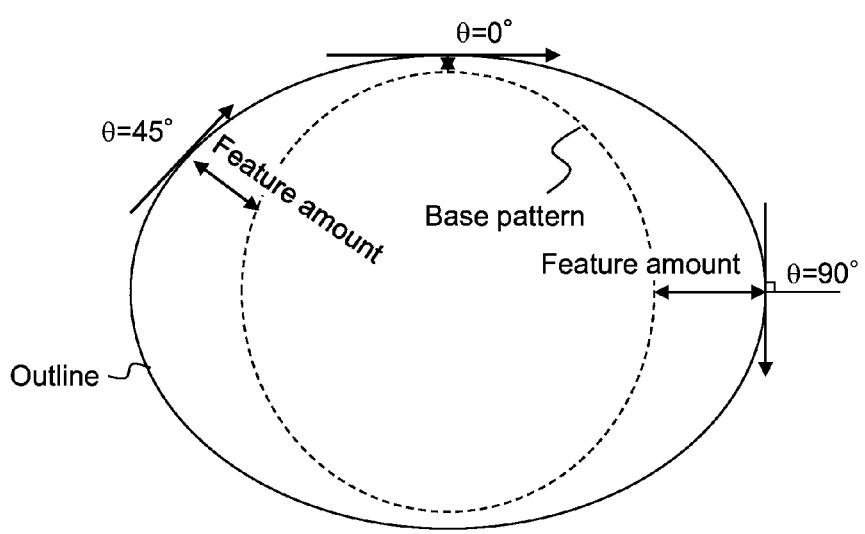
FIG. 27 shows the direction of an outline and the feature amount.

FIG. 27 shows an exemplary image of two images including an image of an outline and an image of a base pattern being aligned and overlapped. In this example, the base pattern is a circle, and the outline of the SEM image 1 is an ellipse, and so the images of different shapes are aligned. The pixel at point A of the outline and the pixel at point A' of the base pattern correspond to each other, and distance values of all of the pixels such as the distance value between the point A pixel and the point A' pixel and the distance value between the point B pixel and the point B' pixel are found as a feature amount.

Figure 24:
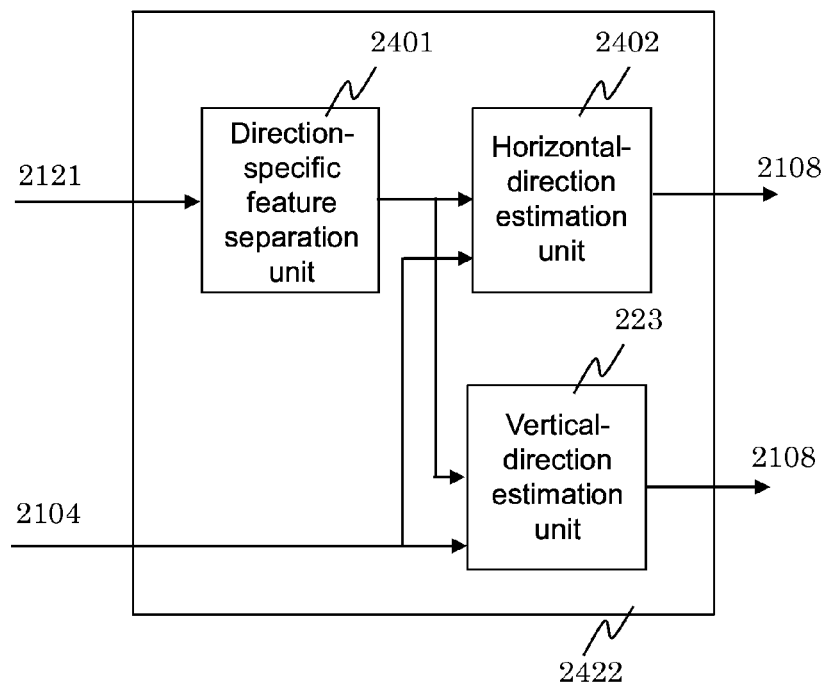
FIG. 24 shows an embodiment of a direction-specific exposure condition estimation unit.

FIG. 24 shows one example of the direction-specific exposure condition estimation unit. In the direction-specific exposure condition estimation unit 2422, a direction-specific feature separation unit 2401 calculates a feature amount for each direction using outline data for the feature amount for each pixel obtained at the feature amount extraction unit 2121, and a horizontal-direction estimation unit 2402 and a vertical-direction estimation unit 2403 estimate exposure conditions in the respective directions using the directions-specific model.

Figure 25:
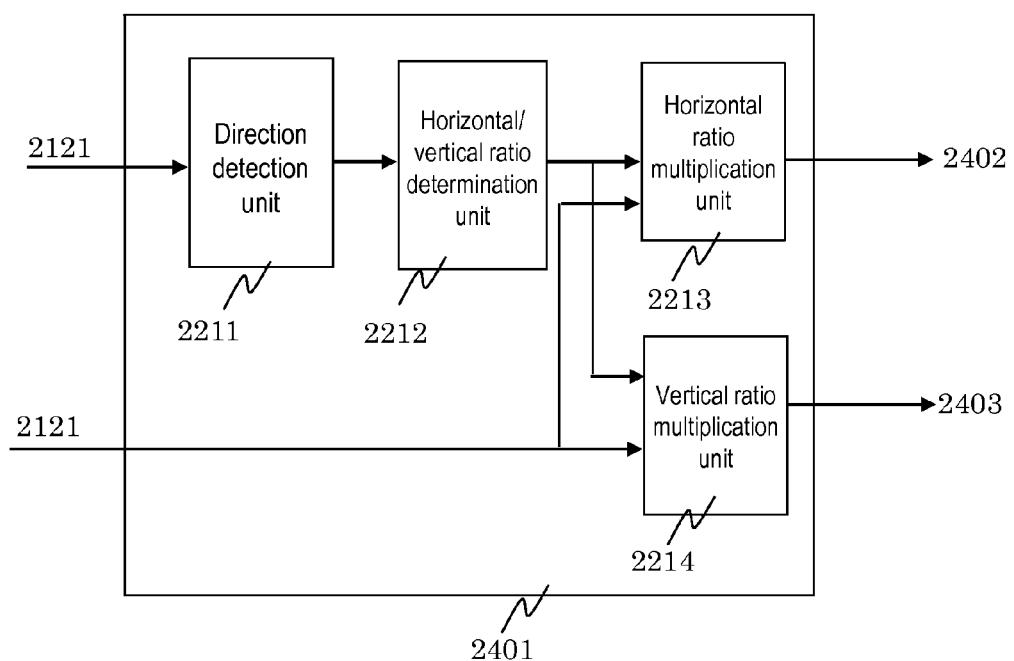
FIG. 25 shows an embodiment of a direction-specific feature separation unit.
Figure 26:
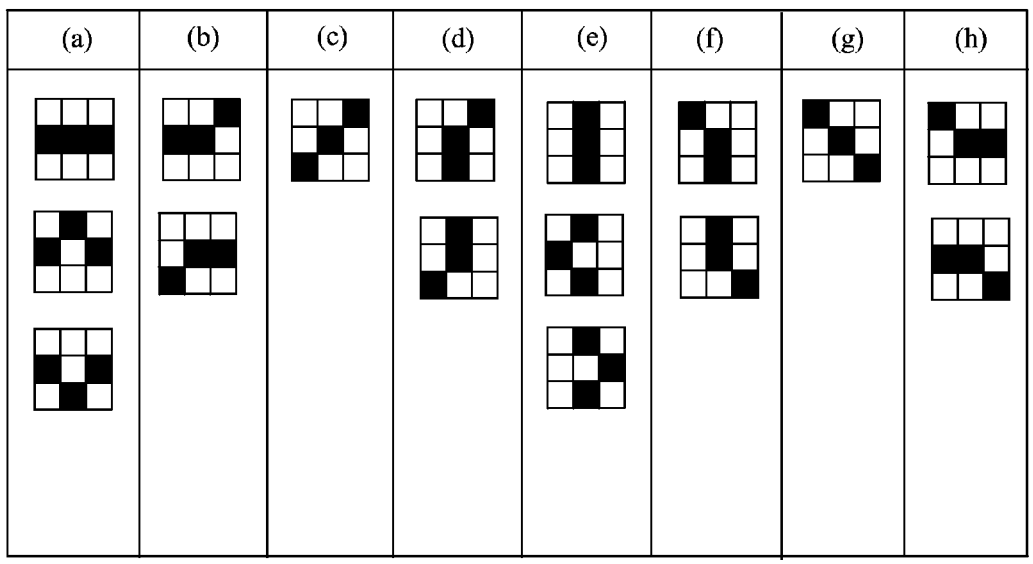
FIG. 26 shows a pattern for each direction that is used by a direction detection unit.

FIG. 25 shows one example of the direction-specific feature separation unit. The direction-specific feature separation unit 211 finds a feature amount for each direction using the feature amount for each pixel obtained by the feature amount extraction unit 2121. A direction detection unit 2211 finds the direction of the outline pixel as a target using the outline data at the periphery of the outline pixel as the target, the feature amount of which is obtained by the feature amount extraction unit 2121. Then, a horizontal/vertical ratio determination unit 2212 uses the direction found by the direction detection unit 221 to determine the ratio of a change in exposure condition between in the horizontal direction and in the vertical direction of the feature amount. Then, a horizontal ratio multiplication unit 2213 and a vertical ratio multiplication unit 2214 multiply the feature amount for each pixel by the ratios found by the horizontal/vertical ratio determination unit 2212, thus funding the feature amount for each direction of the horizontal direction and the vertical direction.

The direction detection unit 2211 finds the orientation of the outline pixel using the outline data at the periphery of the outline pixel as the target, whose feature amount is obtained. For instance, pattern matching may be performed using the array of outline pixels in the matrix of 3 pixels×3 pixels as shown in FIG. 6 for direction detection. Herein, the black pixels correspond to the outline pixels, and pattern matching is performed using the patterns from (a) to (h). Patterns (a) to (h) have the directions (angles θ) of 0°, 22.5°, 45°, 67.5°, 90°, 112.5°, 135° and 157.5°, respectively. When the direction is to be found in more details, the number of pixels may be increased in size to the matrix of 5 pixels×5 pixels, for example, whereby the number of the patterns for the direction to be found may be increased.

The horizontal/vertical ratio determination unit 2212 determines the ratio of influence on the focus in the horizontal direction and the vertical direction of a feature amount depending on the direction of the outline found by the direction detection unit 2211. For instance, at the point A of FIG. 27, the direction of the outline is 0°. In this case, the ratio of the feature amount influencing the focus in the vertical direction is 1.0, and the ratio of the feature influencing the focus in the horizontal direction is 0.0. At the point B, where the direction of the outline is 90°, and in this case, the ratio of the feature amount influencing the focus in the vertical direction is 0.0, and the ratio of the feature influencing the focus in the horizontal direction is 1.0. At the point C, where the direction of the outline is 45°, and in this case, the ratio of the feature amount influencing the focus in the vertical direction is 0.5, and the ratio of the feature amount influencing the focus in the horizontal direction is 0.5. The equations to find such a ratio are $\cos\theta/(\sin\theta+\cos\theta)$ for the ratio of the feature amount influencing the focus in the vertical direction, and $\sin\theta/(\sin\theta+\cos\theta)$ for the ratio of the feature amount influencing the focus in the horizontal direction, where $\theta(°)$ is the angle of the direction found by the direction detection unit 2211.

When the roughness of the outline is large, an approximate line may be created using a plurality of sample pixels at the periphery of the outline pixel as a target, thus finding the direction. Alternatively, the outline may be extracted by sufficiently smoothing the SEM image 2101.

The direction-specific ratios of the feature amount are sent to the horizontal ratio multiplication unit 2213 and the vertical ratio multiplication unit 2214, by which the feature amount for each pixel is multiplied, thus outputting the feature amount for each direction. The horizontal ratio multiplication unit 2213 and the vertical ratio multiplication unit 2214 can be implemented by a multiplier. The feature amount found by the horizontal ratio multiplication unit 2213 is input to the horizontal-direction estimation unit 2402 of FIG. 24, and the feature amount found by the vertical ratio multiplication unit 2214 is input to the vertical-direction estimation unit 2403.

Figure 28A:
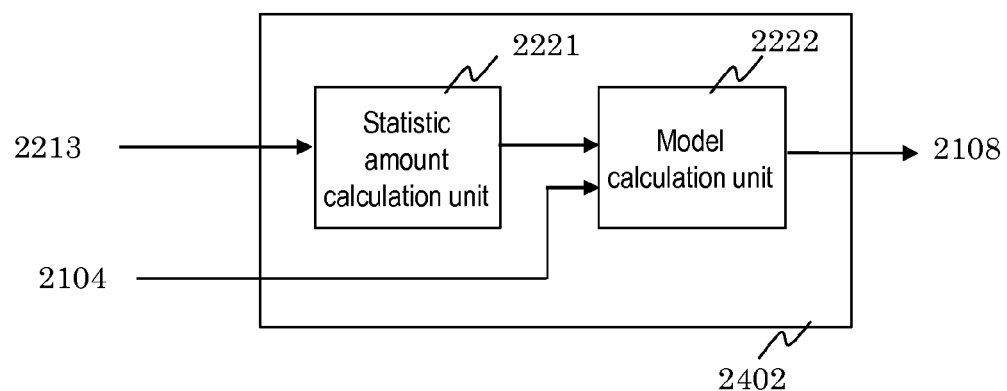
FIG. 28 shows one embodiment of a horizontal-direction estimation unit and a vertical-direction estimation unit.
Figure 28B:
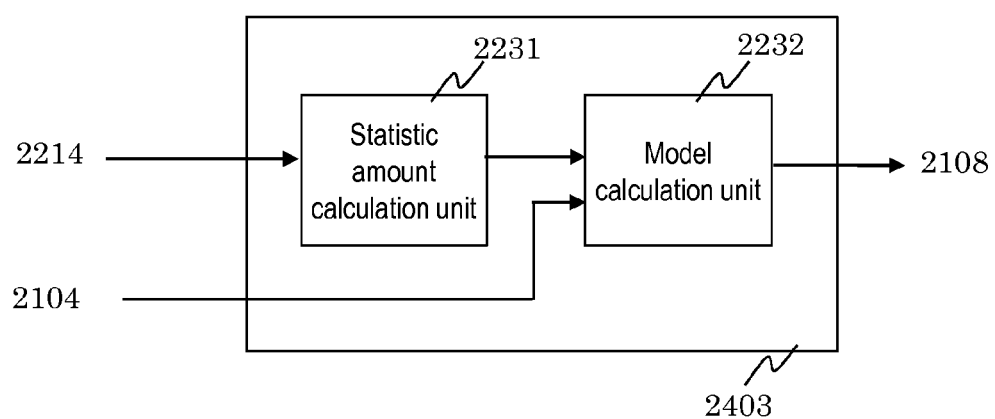

FIG. 28 shows one example of the horizontal-direction estimation unit and the vertical-direction estimation unit. In the horizontal-direction estimation unit 2402 of FIG. 28A, a statistic amount calculation unit 2221 finds the sum of the feature amounts of all outline pixels found by the horizontal ratio multiplication unit 2213, and finds the statistic amount such as the average value or the dispersion value. The skewness, the kurtosis and the like may be found. Then, a model calculation unit 2222 uses the thus found plurality of statistic values and the direction-specific model to find the focus value and the dose in the horizontal direction. The model calculation unit 2222 performs the calculation using the model corresponding to the exposure condition in the horizontal direction of the direction-specific model. The model may be calculated, for example, by finding the exposure condition that is obtained by multiplying the corresponding weight to a plurality of statistic amounts. The vertical-direction estimation unit 2403 of FIG. 28B also can find the exposure condition in the vertical direction similarly. These exposure conditions in the horizontal direction and the vertical direction are output as direction-specific exposure condition information 8.

Figure 29:
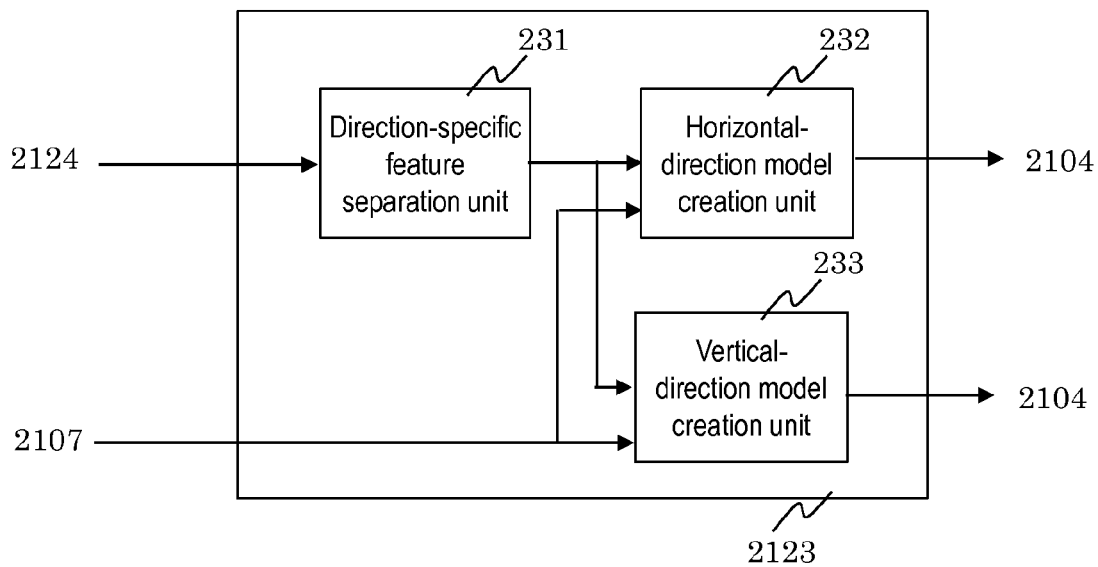
FIG. 29 shows one embodiment of a direction-specific exposure condition model creation unit.

Referring to FIG. 29, one example of the direction-specific exposure condition model creation unit 2123 of FIG. 21B is described below. A direction-specific feature separation unit 231 is the same as the direction-specific feature separation unit 2401 of the direction-specific exposure condition estimation unit 2122 of FIG. 21A, and outputs feature amounts separately for the horizontal direction and the vertical direction. A horizontal-direction model creation unit 232 creates a model using the exposure condition information 2107 and the feature amount in the horizontal direction. A vertical-direction model creation unit 233 creates a model using the exposure condition information 7 and the feature amount in the vertical direction.

Figure 30A:
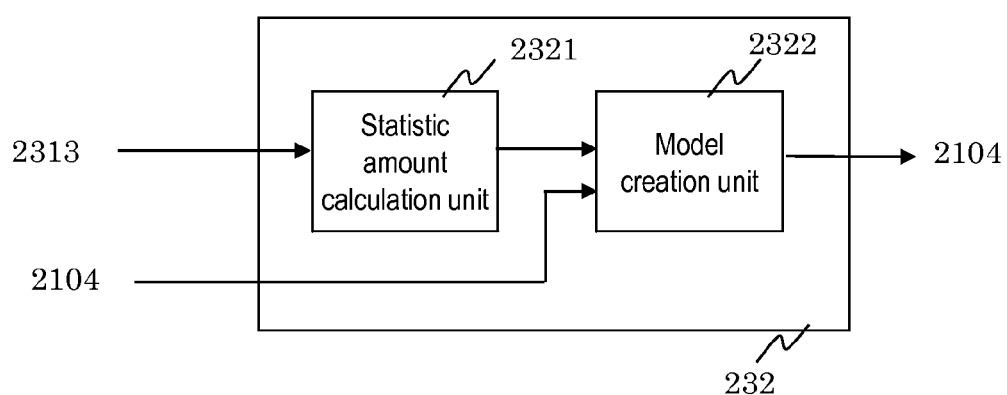
FIG. 30 shows one embodiment of a horizontal-direction model creation unit and a vertical-direction model creation unit.
Figure 30B:
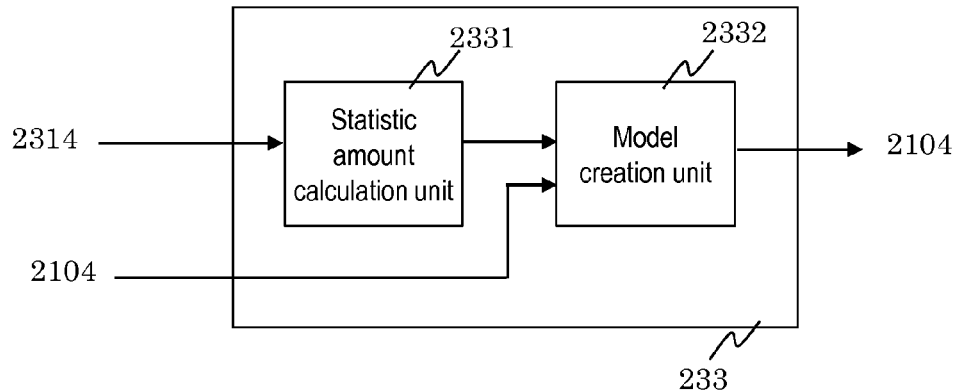

FIG. 30 shows one example of the horizontal-direction model creation unit and the vertical-direction model creation unit. In the horizontal-direction estimation unit 232 of FIG. 30A, a statistic amount calculation unit 2321 finds the sum of the feature amounts of all outline pixels found by the horizontal ratio multiplication unit 2313, and may find the statistic amounts such as the average value and the dispersion value as well as the skewness, the kurtosis and the like. Then, a model creation unit 2322 uses the thus found plurality of statistic values and the exposure condition information 2107 to create a model indicating the relationship between the found statistic amounts and the exposure condition in the horizontal direction. The model may be a regression equation to find an exposure condition with a linear sum including a plurality of statistic values that are multiplied by their coefficients. For instance, the exposure condition Y may be represented in the regression equation by the linear sum of the feature amounts A1, A2 . . . An with their respective weight coefficients X1, X2, . . . Xn, $$Y = X1A1 + X2A2 + \ldots XnAn + b.$$

In this case, the model will be values of the weight coefficients X1, X2, . . . Xn of these statistic values and b. This may be found by non-linear regression or by linear programming. The weight may be found by learning using a plurality of statistic values and its exposure conditions. Similarly, in the vertical-direction estimation unit 233 of FIG. 10B, a statistic amount calculation unit 2331 finds the sum of the feature amounts of all outline pixels found by the vertical ratio multiplication unit 2314, and finds the statistic amounts such as the average value and the dispersion value. Then, a model creation unit 2332 uses the thus found plurality of statistic values and the exposure condition information 7 to create a model indicating the relationship between the found statistic amounts and the exposure condition in the horizontal direction. The models created by the model creation units 2322 and 2332 are output as direction-specific models 2104.

As stated above, weight is applied to the statistic amount of the feature amount for each of a plurality of angles (directions), which are then added, for example, whereby the exposure condition in X-direction or Y-direction (specific direction) is found, and so the exposure condition can be found by referring to not only the feature amount in one direction but also the feature amounts in a plurality of directions. Even when the amount of information in a specific direction is not sufficient, information in a plurality of directions can be referred to, and so the insufficiency of the information can be compensated and an appropriate exposure condition can be found. The exposure condition may be determined while referring to the appearance of the pattern other than in X and Y directions. In the above equation, the exposure condition Y is a result of the addition of the measurement values in a plurality of directions, to which weight is applied, which may be a statistic value (average value).

The exposure condition mentioned herein may be a parameter that is required to adjust the exposure condition in a specific direction, which includes an exposure condition of the exposure device during monitoring, the adjustment amount (e.g., ideal condition and exposure condition during monitoring), for example. Alternatively, the adjustment distance of a scale bar to adjust the exposure condition on a GUI screen may be found by the above regression equation, table or the like.

Figure 31:
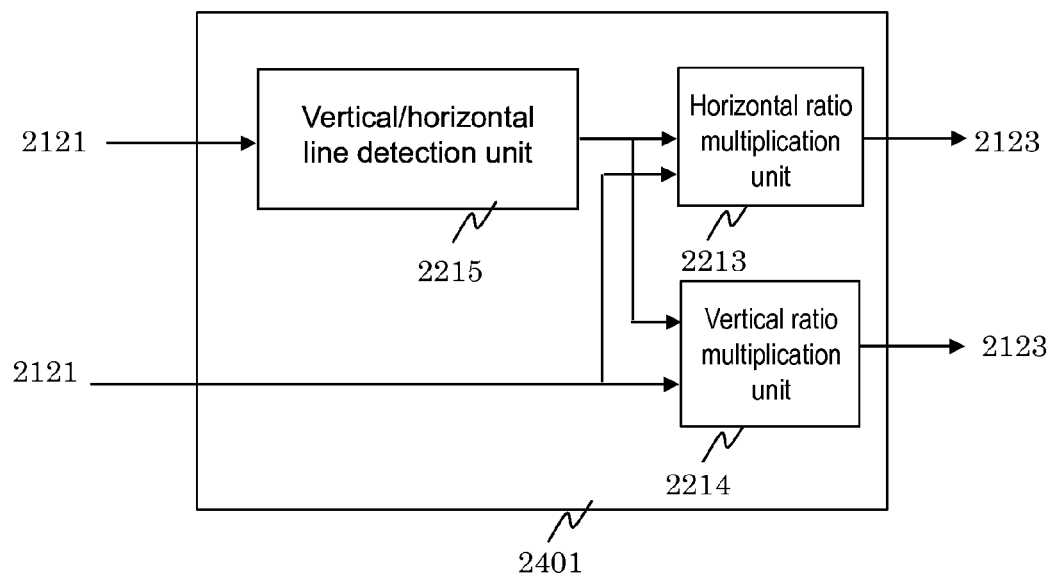
FIG. 31 shows one embodiment of a direction-specific separation unit.

When the direction-specific feature separation unit 2401 described referring to FIG. 25 deals with a pattern with less curves, the direction detection unit 2211 and the horizontal/vertical ratio determination unit 2212 may be replaced with a vertical/horizontal line detection unit 2215 as shown in FIG. 31, for example, so that linear patterns of horizontal lines (lateral lines) and vertical lines (longitudinal lines) may be detected. When a pixel is detected as a lateral line, the ratio at the horizontal ratio multiplication unit is 1.0, and the ratio at the vertical ratio multiplication unit is 0.0. When a pixel is detected as a lateral line, the ratio at the horizontal ratio multiplication unit is 0.0, and the ratio at the vertical ratio multiplication unit is 1.0. In this case, when it is not a lateral line or a longitudinal line, the ratio at the horizontal ratio multiplication unit may be 0.0, and the ratio at the vertical ratio multiplication unit may be 0.0. Herein the direction is found from the outline, and the outline that is input to the direction detection unit 2211 of FIG. 25 or the vertical/horizontal line detection unit 2215 of FIG. 31 may be replaced with a base pattern, and the direction of the base pattern may be found and the ratio of the feature amount in the horizontal direction and in the vertical direction may be found similarly. When the configuration is changed in FIG. 25 and FIG. 31, the direction-specific exposure condition model creation unit in FIG. 21B also has to be changed similarly.

Figure 32A:
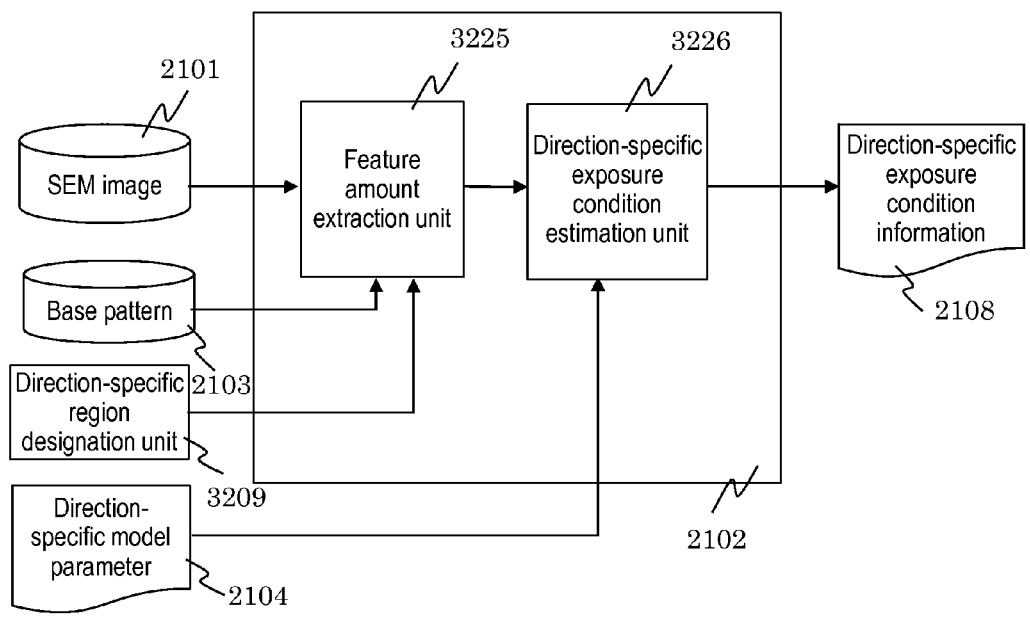
FIG. 32 shows an embodiment of an image evaluation apparatus.

FIG. 32 shows one example of the image evaluation apparatus when a user designates a region where the feature amount is to be found for each direction. The configuration includes a direction-specific region designation unit 3209 in addition to the image evaluation apparatus of FIG. 21. The direction-specific region designation unit 3209 is provided with means for display and means to designate a region, and as shown in FIG. 33, this is a GUI that allows a user to designate freely a rectangle (1) representing a feature region in the horizontal direction and a rectangle (2) representing a feature region in the vertical direction for the outline obtained from the SEM image or the line A representing the base pattern. Information on the regions designated by the direction-specific region designation unit 9 is input to the feature amount extraction unit 25.

Figure 34:
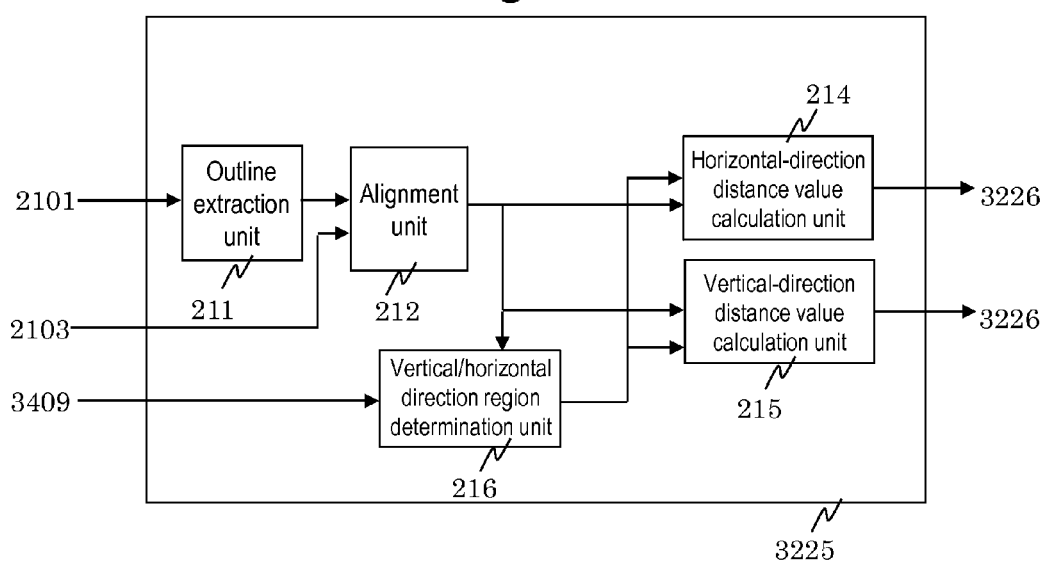
FIG. 34 shows an embodiment of a feature amount extraction unit.

FIG. 34 shows one example of the feature amount extraction unit. In this unit, an outline that is extracted by the outline extraction unit 211 from the SEM image 1 is aligned with the base pattern by the alignment unit 212. That is the same processing as in the feature amount extraction unit 2121. Then, a vertical/horizontal direction region determination unit 216 determines whether the target pixel is included in the feature region in the horizontal direction or in the feature region in the vertical direction that the user designates. When the pixel is included in the feature region in the horizontal direction, the feature amount (distance value between the target outline pixel and the corresponding pixel of the base pattern) corresponding to the target pixel subjected to alignment is output as a value (feature amount in the horizontal direction) of a horizontal-direction distance value calculation unit 214. When the pixel is included in the feature region in the vertical direction, the feature amount obtained at the target pixel is output as a value (feature amount in the vertical direction) of a vertical-direction distance value calculation unit 215. When it is not included in the feature region in the horizontal direction or in the feature region in the vertical direction, such a pixel may be excluded. Herein, the target pixel that is determined by the vertical/horizontal direction region determination unit 216 may be an outline pixel, or a pixel of the corresponding base pattern may be a target pixel.

Figure 35:
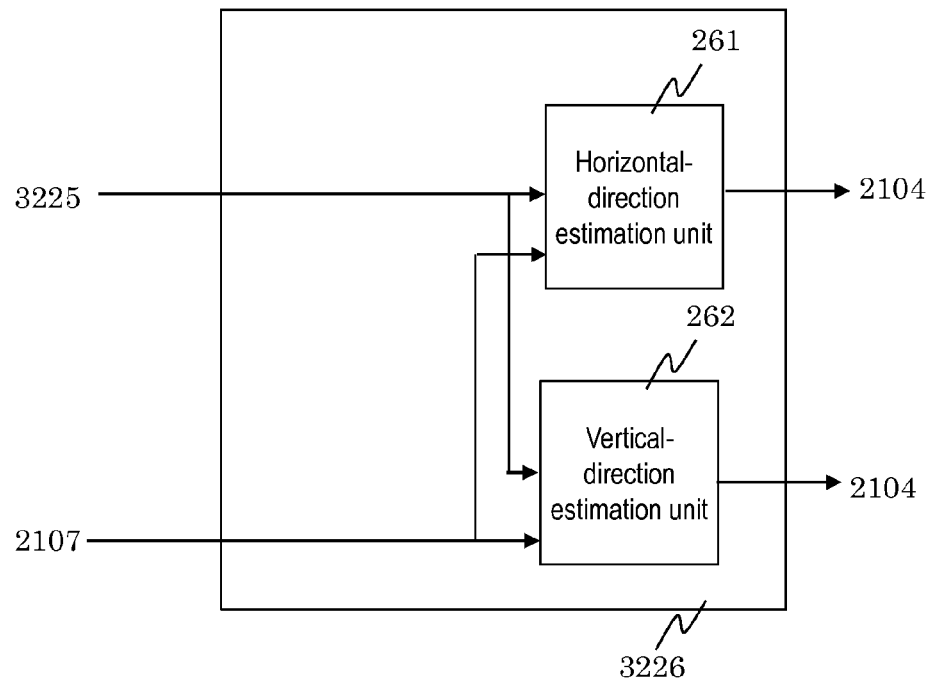
FIG. 35 shows one embodiment of a direction-specific exposure condition estimation unit.

The value of the horizontal-direction distance value calculation unit 214 and the value of the vertical-direction distance value calculation unit 215 are input to a direction-specific exposure condition estimation unit 3226. FIG. 35 shows one example of the direction-specific exposure condition estimation unit. A horizontal-direction estimation unit 261 uses the value of the horizontal-direction distance value calculation unit 214 and the direction-specific model to estimate the exposure condition in the horizontal direction. A vertical-direction estimation unit 262 uses the value of the horizontal-direction distance value calculation unit 215 and the direction-specific model to estimate the exposure condition in the horizontal direction. The horizontal-direction estimation unit 261 and the vertical-direction estimation unit 262 may be implemented with the same configuration as that of the horizontal-direction estimation unit 2402 and the horizontal-direction estimation unit 2403 described with reference to FIG. 28.

Figure 32B:
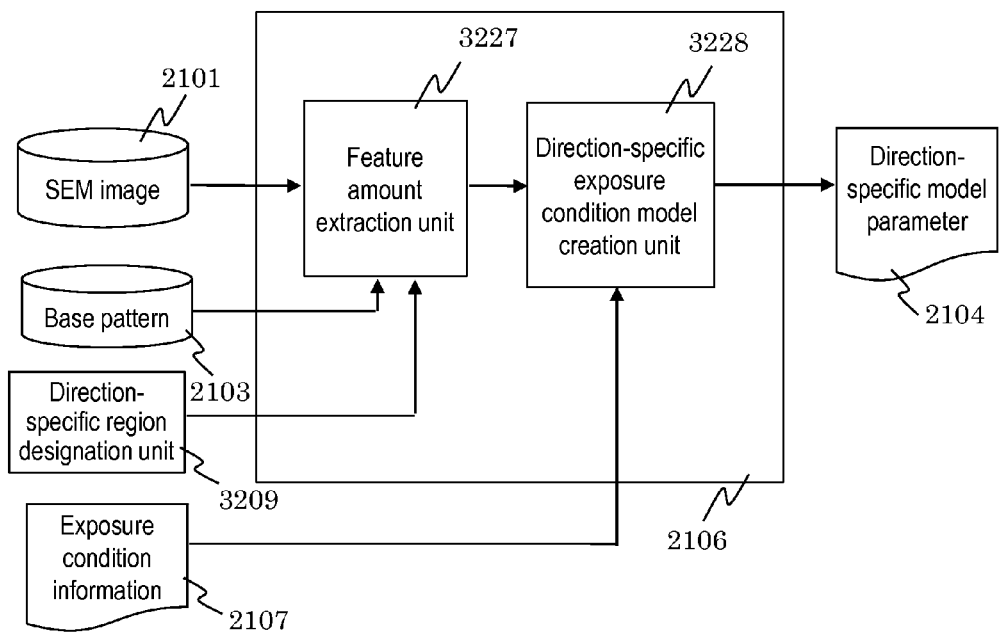
Figure 33:
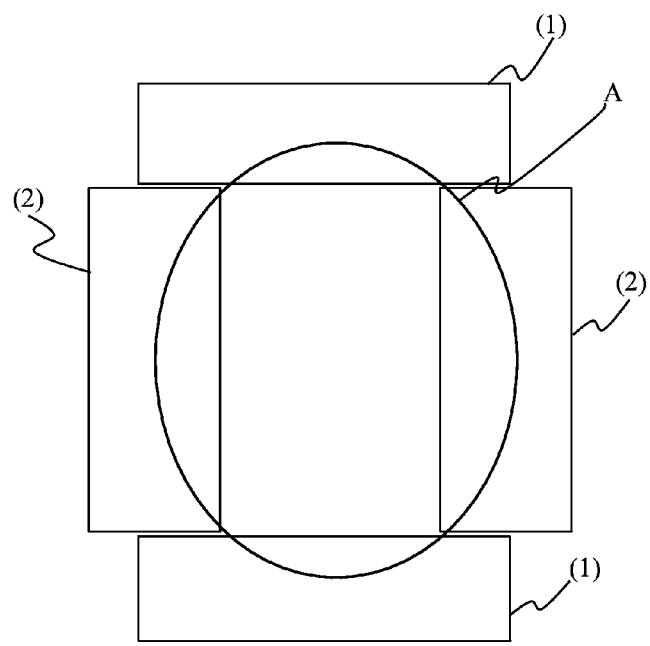
FIG. 33 shows one example to designate a region by a direction-specific region designation unit.
Figure 36:
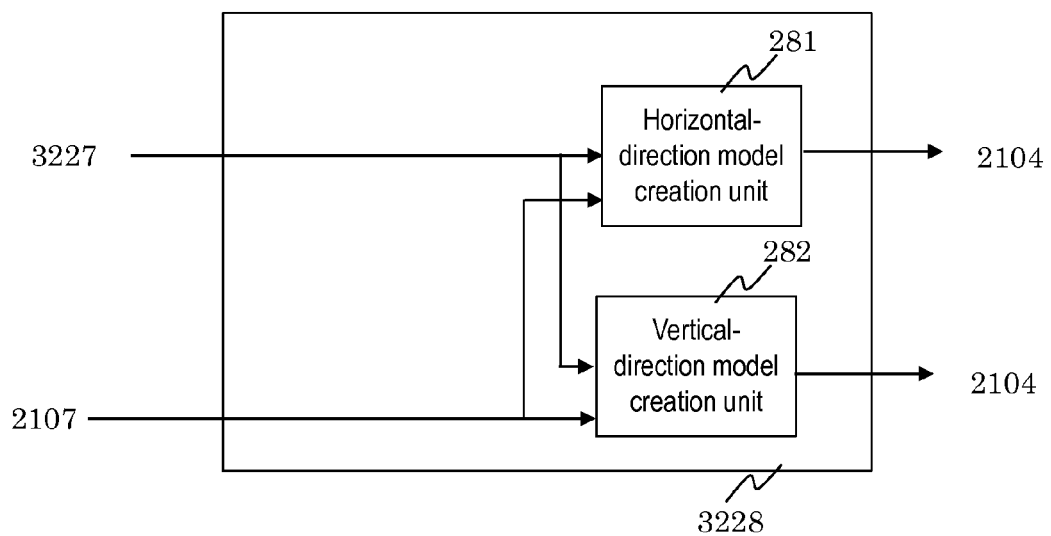
FIG. 36 shows one embodiment of a direction-specific exposure condition model creation unit.

A feature amount extraction unit 3227 of FIG. 32B can be implemented with the same configuration as that of FIG. 34. A direction-specific exposure condition model creation unit 3228 is described with reference to FIG. 36. Feature amounts in the horizontal direction and in the vertical direction that are obtained by the direction-specific exposure condition estimation unit 3227 are input to a horizontal-direction model creation unit 281 and a vertical-direction model creation unit 282, and the horizontal-direction model creation unit 281 uses the exposure condition information 7 to create a model to find the exposure condition in the horizontal direction, and the vertical-direction model creation unit 282 creates a model to find the exposure condition in the vertical direction.

The horizontal-direction model creation unit 281 and the vertical-direction model creation unit 282 can be implemented with the same configuration as that of the horizontal-direction model create unit 231 and the vertical-direction model creation unit 232 described with reference to FIG. 30.

Figure 37:
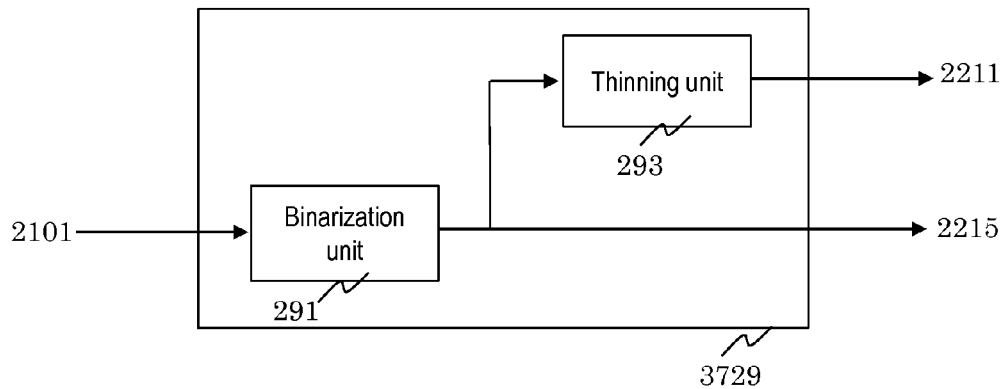
FIG. 37 shows one embodiment of a feature amount extraction unit.
Figure 38:
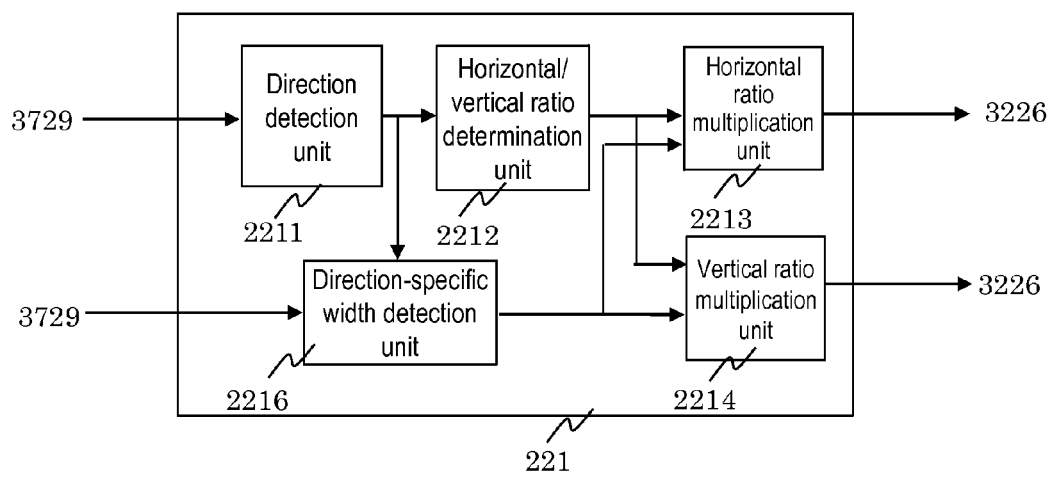
FIG. 38 shows one embodiment of a direction-specific feature separation unit.

The feature amount extraction unit 2121 in FIG. 21 and FIG. 32 extracts an outline from the SEM image, and compares it with the base pattern to find a feature amount, which is not a limiting example, and information on the width of the white band of the SEM image may be used as the feature amount. In that case, as shown in FIG. 37, a binarization unit 291 binarizes the SEM image with any threshold so that pixels are binarized into white pixels that are a white band along the pattern shape of the SEM image and black pixels that are other pixels. A thinning unit 293 performs thinning of the binarized image, thus obtaining an outline image. Such binarized image and image of the outline are input to the direction-specific feature separation unit in the direction-specific exposure condition estimation unit of FIG. 24. FIG. 38 shows one example of the direction-specific feature separation unit in this case. This includes a direction-specific width detection unit 2216 in addition to the direction-specific exposure condition estimation unit of FIG. 24. Then, the feature amount used is the output of this direction-specific width detection unit 2216 instead of the output of the distance value calculation unit 213. Using the direction of the target pixel of the outline that is obtained by the direction-specific feature separation unit, the white band width in the vertical direction is found with reference to the direction.

Figure 39:
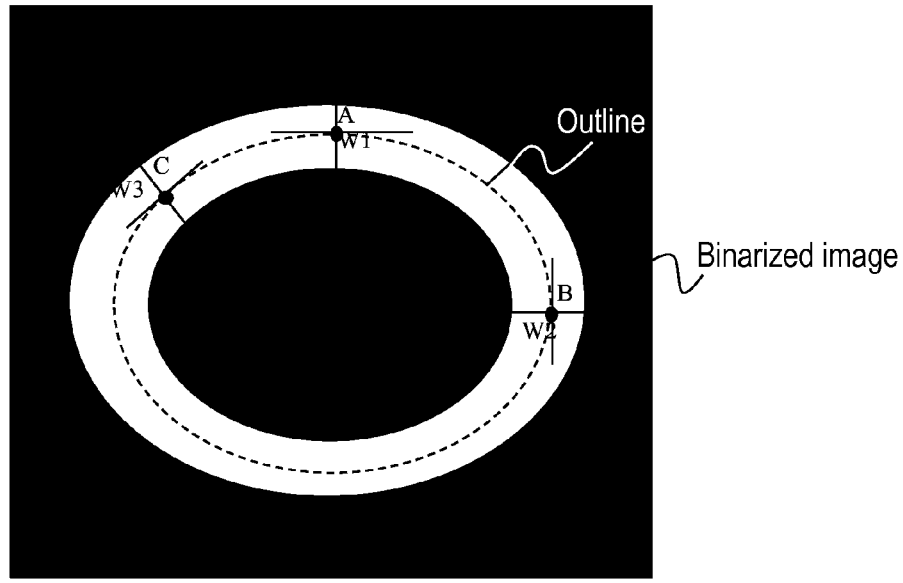
FIG. 39 shows the direction of an outline and the feature amount.

For instance, when the white band width is found using a binarized image of a hole pattern as in FIG. 39, since the direction of the outline of the point A pixel is the horizontal direction, the width of the white band (white pixels) W1 in the vertical direction is found. Since the direction of the outline of the point B pixel is vertical, the width of the white band in the horizontal direction is found. Then, the thus found width of the white band may be used as a feature amount. Instead of binarization, a derivative value of the white band, a gradient of specific two thresholds or the like ma be used. For these various types of feature amounts, the feature amount for each direction can be found by the above method using the outline or the base pattern. Then, the feature for each direction used enables finding of the exposure direction for each direction.

Figure 40:
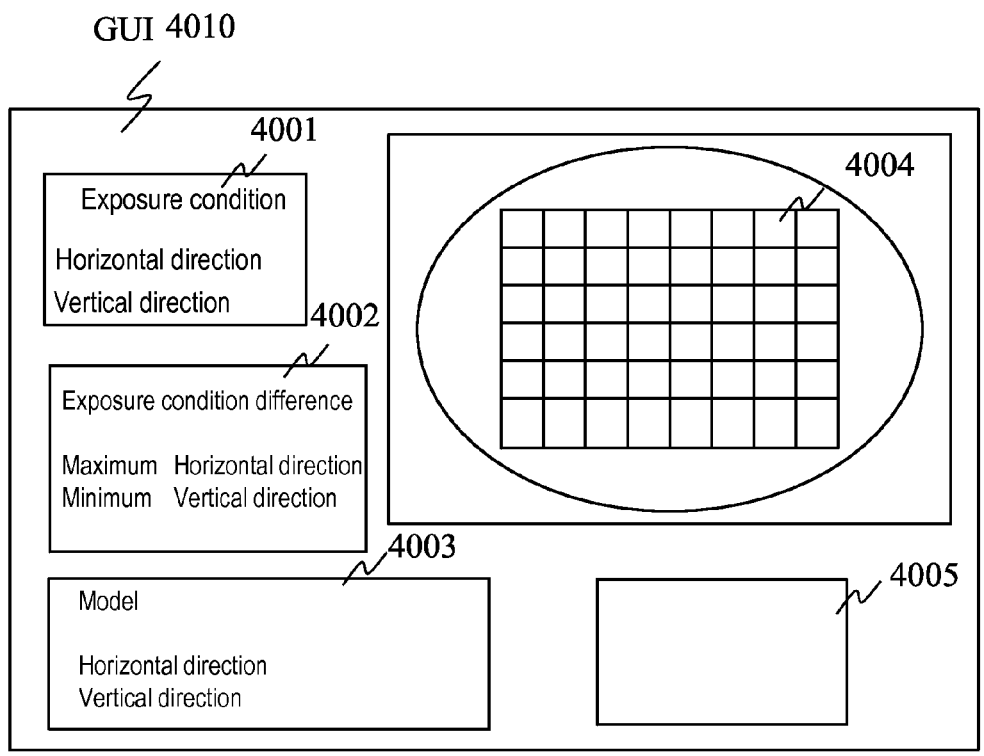
FIG. 40 shows one embodiment of a GUI as input/output.

FIG. 40 shows one example of a GUI displayed as input/output. The exposure condition may be displayed while switching it for each direction. For instance, when an exposure condition is displayed on a wafer map 4004, an instruction unit 4001 to switch the display of the exposure condition for each direction may be provided, and the exposure condition in the horizontal direction and the exposure condition in the vertical direction, for example, may be displayed on the wafer map 4004 while being switched. An instruction unit 4002 may be provided, allowing the maximum value, the minimum value, the average value and the like of the exposure condition to be found or displayed for each direction in all directions. An instruction unit 4003 may be provided, allowing instruction of information on a model to estimate the exposure condition for each direction, e.g., a coefficient corresponding to the feature amount, for display.

Figure 41:
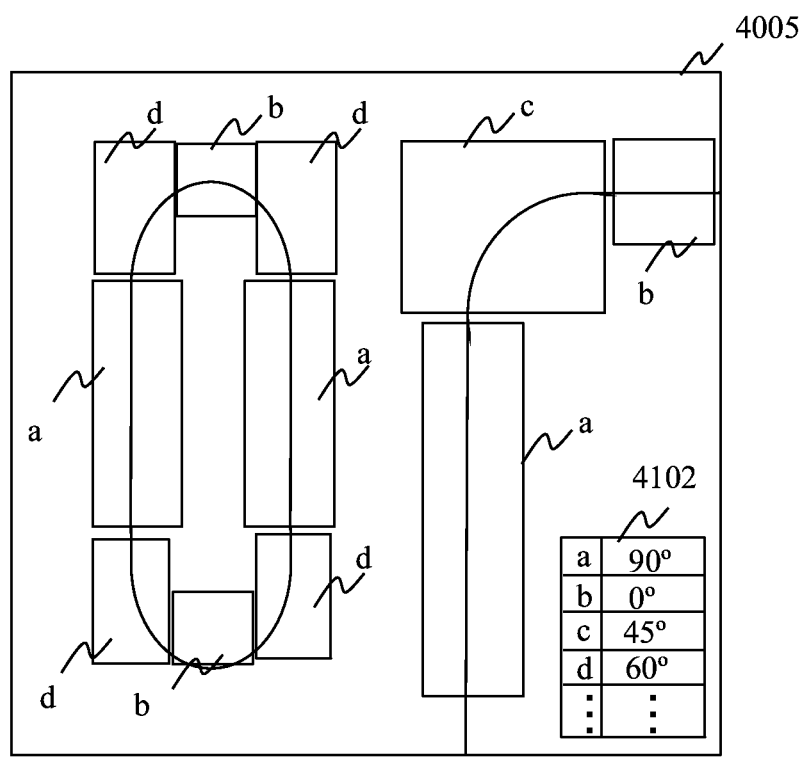
FIG. 41 shows one example to designate a region for each direction.

Although the above describes the example where the exposure conditions in the vertical direction and the horizontal direction are found, the exposure conditions in all directions such as oblique directions such as 45° and 30° may be found similarly. In that case as well, it may be configured so as to allow a user to designate a region for each direction. For instance, a display unit 4005 to display a base pattern or an outline of a SEM image may be provided as shown in FIG. 41, where the user can designate a rectangle c region to show the region of oblique 45° and a rectangle d region to show the region of 60° in addition to the rectangle b region to show the horizontal region and the rectangle a region to show the vertical region. A setting unit 4102 to set these regions and designation of angles may be provided. A user may allocate regions in all directions. The above apparatus may be implemented by software processing using a personal computer. Alternatively, the apparatus may be implemented as a LSI.

REFERENCE SIGNS LIST

1 exemplary model creation unit
2 exposure condition estimation unit
11, 21 outline creation unit
11*n*, 1101, 1102 outline creation unit
12 model creation unit
13 evaluation unit
22 estimation unit 30, 37 exposure condition information
31, 36 SEM image
32, 35 outline creation parameter
33 base pattern
34 model
121, 221 feature amount calculation unit
122 model-creation unit
131 model evaluation unit
132 storage/selection unit
222 model calculation unit
1100 outline storage unit

The invention claimed is:

1. An image evaluation apparatus configured to find an exposure condition of a semiconductor pattern from an image shot with an electron beam, comprising:
 a storage unit that stores a model indicating a relationship between a feature amount that is obtained by creating three or more outlines from a SEM image and an exposure condition, and outline creation parameter information to create three or more outlines corresponding to the model;
 a controller, configured to:
  create three or more outlines from a SEM image using the outline creation parameter information;
  find a plurality of feature amounts through measurement, in a region including a part of the pattern, of dimensions between corresponding points of the three or more outlines and a base pattern stored beforehand that has the same edges as those of the three or more outlines;
  substitute the plurality of feature amounts obtained through the measurement into a model that is an arithmetic equation indicating a relationship between the plurality of feature amounts, weight coefficients for the respective feature amounts, and an exposure condition; and
  find a corresponding exposure condition.

2. The image evaluation apparatus according to claim 1, wherein the outline creation parameter information is information to enable the controller to create an outline, and includes the number of outlines and information to create each of the outlines corresponding to the number.

3. The image evaluation apparatus according to claim 2, wherein the feature amount is a statistic amount relating to a distance between the base pattern and each outline created.

4. The image evaluation apparatus according to claim 3, wherein the base pattern is a pattern based on design data, a simulation pattern or a pattern that is created from one or a plurality of SEM images.

5. The image evaluation apparatus according to claim 4, further comprising a monitor configured to display a value relating to the found exposure condition on a monitor, and to display a value relating to an exposure condition at a position corresponding to a shot position of the SEM image.

6. An image evaluation apparatus configured to create a model using an exposure condition of a plurality of semiconductor patterns and a plurality of SEM images corresponding thereto, comprising:
 a controller, configured to:
  create three or more outlines from at least one of the a SEM images using outline creation parameter information including three or more outline creation parameters to create one outline;
  create a model from a feature amount obtained from the plurality of outlines created by an outline creation unit and an exposure condition corresponding to a SEM image; and
  find a plurality of feature amounts through measurement, in a region including a part of the pattern, of dimensions between corresponding points of the three or more outlines and a base pattern stored beforehand that has the same edges as those of the three or more outlines,
  find a plurality of models that are arithmetic equations indicating a relationship between the plurality of feature amounts, weight coefficients for the respective feature amounts, and an exposure condition; and
  find a model with good evaluation from the plurality of models; and
  find outline creation parameter information corresponding to the model with good evaluation.

7. The image evaluation apparatus according to claim 6, wherein the controller is configured to create three or more outlines.

8. The image evaluation apparatus according to claim 7, wherein the outline creation parameter information is information enable the controller to create an outline, and includes the number of outlines and information to create each of the outlines corresponding to the number.

9. The image evaluation apparatus according to claim 8, wherein the number of outlines included in the outline creation parameter information is three or more.

10. The image evaluation apparatus according to claim 9, wherein the feature amount is a statistic amount relating to a distance between the base pattern and each outline created.

11. The image evaluation apparatus according to claim 10, wherein the base pattern is a pattern based on design data, a simulation pattern or a pattern that is created from one or a plurality of SEM images.

12. The image evaluation apparatus according to claim 11, wherein the controller is configured to perform evaluation about fitting of a model.

13. An image evaluation apparatus configured to find an exposure condition of a semiconductor pattern from an image shot with an electron beam comprising:
 an input configured to receive input by a user that sets a parameter to create three or more outlines from a SEM image;
 a controller, configured to:
  create three or more outlines from a SEM image using the parameter;
  find a plurality of feature amounts through measurement, in a region including a part of the pattern, of dimensions between corresponding points of the three or more outlines and a base pattern stored beforehand that has the same edges as those of the three or more outlines;
  substitutes the plurality of feature amounts obtained through the measurement into a model that is an arithmetic equation indicating a relationship between the plurality of feature amounts, weight coefficients for the respective feature amounts, and an exposure condition; and
  finds a corresponding exposure condition.

14. The image evaluation apparatus according to claim 13 wherein each of the feature amounts is a statistic amount relating to a distance between the base pattern and each outline created.

15. The image evaluation apparatus according to claim 14 wherein the base pattern is a pattern based on design data, a simulation pattern or a pattern that is created from one or a plurality of SEM images.

16. A pattern shape evaluation apparatus including an image processing apparatus configured to evaluate a target pattern included in an image formed by an image acquisition apparatus the pattern shape evaluation apparatus comprising
an input configured to receive input by a user that sets a parameter to create three or more outlines from a SEM image;
a controller, configured to:
create three or more outlines from a SEM image using the parameter;
find a plurality of feature amounts through measurement, in a region including a part of the pattern dimensions, of dimensions between corresponding points of the three or more outlines and a base pattern stored beforehand that has the same edges as those of the three or more outlines;
substitutes the plurality of feature amounts obtained through the measurement into a model that is an arithmetic equation indicating a relationship between the plurality of feature amounts, weight coefficients for the respective feature amounts, and an exposure condition; and
finds a corresponding exposure condition,
wherein the model includes different weights assigned for a plurality of directions.

17. The pattern shape evaluation apparatus according to claim 16, wherein the controller is configured to find a white band for the target pattern a pattern edge or the feature amount for each direction of an outline.

18. The pattern shape evaluation apparatus according to claim 16, wherein the specific direction includes two directions of X direction and Y direction, and the controller is configured to find the parameter based on a plurality of feature amounts including a feature amount in a direction other than the X direction and the Y direction.

19. The pattern shape evaluation apparatus according to claim 16, wherein the controller is configured to use a model or a table indicating a relationship between feature amounts in the plurality of directions and the parameter to find the parameter.

20. The pattern shape evaluation apparatus according to claim 16, wherein the controller is configured to calculate a coefficient of the weight based on an orientation of the specific direction.

21. The pattern shape evaluation apparatus according to claim 16, wherein the controller is configured to compare the target pattern included in the formed image and a reference pattern stored beforehand to evaluate a pattern included in the image.

22. The pattern shape evaluation apparatus according to claim 16, wherein the image processing apparatus includes a display configured to display an exposure condition on a wafer map while switching the exposure condition for each direction.

23. The pattern shape evaluation apparatus according to claim 16, wherein the image processing apparatus includes an input configured to allow a user to designate a region where a feature amount for each direction is to be found.

* * * * *